(12) United States Patent
Yang et al.

(10) Patent No.: US 12,033,993 B2
(45) Date of Patent: Jul. 9, 2024

(54) DISPLAY DEVICE HAVING PLURALITY OF LIGHT EMITTING ELEMENTS BETWEEN A BANK STRUCTURE

(71) Applicant: Samsung Display Co., Ltd., Yongin-si (KR)

(72) Inventors: Yong Hoon Yang, Hwaseong-si (KR); Min Suk Ko, Cheonan-si (KR); Si Kwang Kim, Daegu (KR); Kab Jong Seo, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 98 days.

(21) Appl. No.: 17/011,897

(22) Filed: Sep. 3, 2020

(65) Prior Publication Data

US 2021/0257349 A1    Aug. 19, 2021

(30) Foreign Application Priority Data

Feb. 17, 2020    (KR) .......................... 10-2020-0019066

(51) Int. Cl.
*H01L 29/205*    (2006.01)
*H01L 23/00*    (2006.01)
(Continued)

(52) U.S. Cl.
CPC ............ *H01L 25/167* (2013.01); *H01L 24/24* (2013.01); *H01L 24/82* (2013.01); *H01L 33/60* (2013.01);
(Continued)

(58) Field of Classification Search
CPC ....... H01L 25/167; H01L 24/24; H01L 24/82; H01L 33/60; H01L 33/62; H01L 27/1225;
(Continued)

(56) References Cited

U.S. PATENT DOCUMENTS

2013/0056834 A1    3/2013    Gwoziecki et al.
2014/0124801 A1*   5/2014    Lee ..................... H01L 25/0753
                                                       257/88
(Continued)

FOREIGN PATENT DOCUMENTS

KR         10-1770632 B1    8/2017
KR    10-2018-0009014 A     1/2018
(Continued)

OTHER PUBLICATIONS

Partial European Search Report issued in corresponding application No. EP 20215503.2, dated Jun. 10, 2021, 11 pages.
(Continued)

*Primary Examiner* — Ismail A Muse
(74) *Attorney, Agent, or Firm* — Lewis Roca Rothgerber Christie LLP

(57) ABSTRACT

A display device includes: a substrate; a first bank on the substrate, at least portions of the first bank being spaced apart from each other; a plurality of first electrodes on the substrate, at least portions of the first electrodes being on portions of the first bank; a second electrode on the substrate, the second electrode being spaced apart from and between adjacent ones of the first electrodes; and a plurality of light emitting elements on the first electrodes and the second electrode.

14 Claims, 22 Drawing Sheets

(51) Int. Cl.
  *H01L 25/16* (2023.01)
  *H01L 33/00* (2010.01)
  *H01L 33/60* (2010.01)
  *H01L 33/62* (2010.01)
  *H01L 27/12* (2006.01)
  *H01L 33/56* (2010.01)

(52) U.S. Cl.
  CPC .......... *H01L 33/62* (2013.01); *H01L 27/1225* (2013.01); *H01L 27/124* (2013.01); *H01L 27/1248* (2013.01); *H01L 27/1255* (2013.01); *H01L 33/56* (2013.01); *H01L 2224/24011* (2013.01); *H01L 2224/24146* (2013.01); *H01L 2224/82143* (2013.01); *H01L 2924/12041* (2013.01); *H01L 2924/1426* (2013.01); *H01L 2933/005* (2013.01); *H01L 2933/0066* (2013.01)

(58) Field of Classification Search
  CPC ............... H01L 27/124; H01L 27/1248; H01L 27/1255; H01L 33/56; H01L 2224/24011; H01L 2224/24146; H01L 2224/82143; H01L 2924/12041; H01L 2924/1426; H01L 2933/005; H01L 2933/0066; H01L 25/0753; H01L 27/3246; H01L 27/323; H01L 27/3248; H01L 27/3262; H01L 27/3279; H01L 27/156; H01L 27/1218; H01L 27/1262
  See application file for complete search history.

(56) References Cited

U.S. PATENT DOCUMENTS

| | | |
|---|---|---|
| 2017/0358631 A1 | 12/2017 | Miyamoto et al. |
| 2018/0019369 A1* | 1/2018 | Cho ........................ H05K 1/181 |
| 2018/0175106 A1* | 6/2018 | Kim ........................ H01L 33/20 |
| 2021/0091050 A1* | 3/2021 | Heo ........................ H01L 33/44 |
| 2021/0265324 A1* | 8/2021 | Kong ...................... H10K 59/131 |
| 2022/0005975 A1* | 1/2022 | Yang ...................... H01L 33/38 |
| 2022/0052107 A1* | 2/2022 | Lee ........................ H01L 25/0753 |
| 2022/0254830 A1* | 8/2022 | Kim ........................ H01L 33/38 |

FOREIGN PATENT DOCUMENTS

| | | |
|---|---|---|
| KR | 10-2018-0055021 A | 5/2018 |
| KR | 10-2018-0072909 A | 7/2018 |
| KR | 10-2019-0143844 A | 12/2019 |
| WO | WO 2020/017719 A1 | 1/2020 |
| WO | WO 2020/027396 A1 | 2/2020 |
| WO | WO 2020/071600 A1 | 4/2020 |

OTHER PUBLICATIONS

Extended European Search Report issued in corresponding EP Application No. 23203709.3, dated Jan. 29, 2024, 9 pages.

* cited by examiner

DISPLAY DEVICE HAVING PLURALITY OF LIGHT EMITTING ELEMENTS BETWEEN A BANK STRUCTURE

CROSS-REFERENCE TO RELATED APPLICATION

This application claims priority to and the benefit of Korean Patent Application No. 10-2020-0019066, filed on Feb. 17, 2020, in the Korean Intellectual Property Office, the disclosure of which is incorporated herein by reference in its entirety.

BACKGROUND

1. Field

Aspects of embodiments of the present disclosure relate to a display device.

2. Description of the Related Art

Display devices have steadily become more important with the development of multimedia technology. Accordingly, various types of display devices, such as an organic light emitting diode (OLED) display, a liquid crystal display (LCD), and the like, have been developed.

A display device is a device for displaying an image and includes a display panel, such as an organic light emitting display panel or a liquid crystal display panel. Among the types of display devices, a light emitting display panel may include a light emitting element (e.g., a light emitting diode (LED)). Examples of a light emitting diode (LED) include an organic light emitting diode (OLED) using an organic material as a fluorescent material and an inorganic light emitting diode using an inorganic material as a fluorescent material.

SUMMARY

Aspects and features of the present disclosure provide a display device including a bank to distinguish neighboring regions and on which electrodes are partially disposed to act as a reflective partition wall.

Aspects and features of the present disclosure also provide a display device with a simplified manufacturing process.

However, aspects and features of the present disclosure are not restricted to those described herein. The above and other aspects and features of the present disclosure will become more apparent to one of ordinary skill in the art to which the present disclosure pertains by referencing the detailed description of the present disclosure given below.

A display device according to an exemplary embodiment includes: a substrate; a first bank on the substrate, at least portions of the first bank being spaced apart from each other; a plurality of first electrodes on the substrate, at least portions of the first electrodes being on portions of the first bank; a second electrode on the substrate, the second electrode being spaced apart from and between adjacent ones of the first electrodes; and a plurality of light emitting elements on the first electrodes and the second electrode.

The display device may further include: a plurality of first contact electrodes respectively on the first electrodes and contacting one end portion of the light emitting elements; and a second contact electrode on the second electrode and contacting another end portion of the light emitting elements.

The first electrodes and the second electrode may have the same width measured in one direction.

A width of the first contact electrodes may be smaller than a width of the second contact electrode.

At least a portion of the first contact electrodes may overlap a portion of the first bank in a thickness direction.

The display device may further include a first insulating layer between the first electrodes and the second electrode and partially covering the first electrodes and the second electrode.

The light emitting elements may be on the first insulating layer.

A length of the light emitting elements may be longer than a distance between the first electrodes and the second electrode.

The display device may further include a second insulating layer between the first electrodes and the second electrode and at least partially covering the light emitting elements.

The display device may further include a second bank between the substrate and the second electrode.

A height of the second bank may be smaller than a height of the first bank.

A display device according to an exemplary embedment includes: a substrate having a plurality of emission regions; a first bank on the substrate and extending around a periphery of the emission regions, the first bank including a first extension portion extending in a first direction and a second extension portion extending in a second direction crossing the first direction; a plurality of external electrodes extending in the second direction and partially on the second extension portion of the first bank; a plurality of internal electrodes between the external electrodes and not overlapping the second extension portion of the first bank; and a plurality of light emitting elements between ones of the external electrodes and ones of the internal electrodes or between ones of the internal electrodes.

The external electrodes may cross the first extension portion of the first bank.

The internal electrodes may cross the first extension portion of the first bank.

The internal electrodes may be spaced apart from the first extension portion of the first bank and are in the emission regions.

The display device may further include: a plurality of first contact electrodes respectively contacting ones of the external electrodes and one end portion of the light emitting elements; and a plurality of second contact electrodes respectively contacting ones of the internal electrodes and another end portion of the light emitting elements.

The display device may further include a plurality of second banks on the substrate and overlapping the internal electrodes.

A display device according to an exemplary embodiment includes: a substrate; a first bank on the substrate and including a first extension portion extending in a first direction and a second extension portion extending in a second direction crossing the first direction; a first electrode and a second electrode extending in the second direction and partially overlapping the second extension portion of the first bank, the first electrode and the second electrode being spaced apart from each other in the first direction; a third electrode between the first electrode and the second electrode and extending in the second direction; a first light emitting element between the first electrode and the third electrode; a second light emitting element between the third electrode and the second electrode; a first contact electrode contacting the first electrode and one end portion of the first light emitting element; a second contact electrode contacting the second electrode and one end portion of the second light emitting element; and a third contact electrode contacting the third electrode, another end portion of the first light emitting element, and another end portion of the second light emitting element.

The first electrode and the second electrode may partially overlap the first extension portion of the first bank, and the third electrode may not overlap the first extension portion of the first bank.

The display device may further include a second bank between the substrate and the third electrode and extending in the second direction.

BRIEF DESCRIPTION OF THE DRAWINGS

The above and other aspects and features of the present disclosure will become more apparent by describing, in detail, exemplary embodiments thereof with reference to the attached drawings, in which.

DETAILED DESCRIPTION

Figure 1:
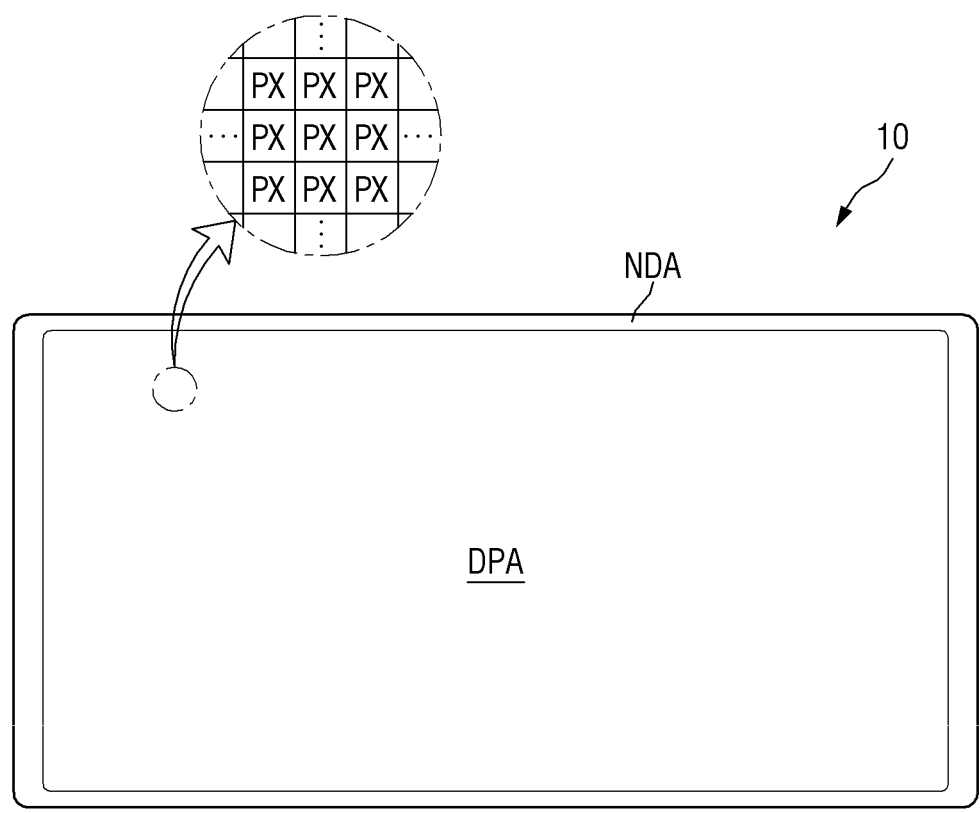
FIG. 1 is a plan view of a display device according to an exemplary embodiment.

The present disclosure will now be described more fully hereinafter with reference to the accompanying drawings, in which example embodiments of the disclosure are shown. The present disclosure may, however, be embodied in different forms and should not be construed as limited to the embodiments set forth herein. Rather, these embodiments are provided so that this disclosure will be thorough and complete and will fully convey the scope of the disclosure to those skilled in the art.

It will be understood that when an element or layer is referred to as being "on," "connected to," or "coupled to" another element or layer, it may be directly on, connected, or coupled to the other element or layer or one or more intervening elements or layers may also be present. When an element or layer is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements.

In the figures, dimensions of the various elements, layers, etc. may be exaggerated for clarity of illustration. The same reference numerals designate the same elements. As used herein, the term "and/or" includes any and all combinations of one or more of the associated listed items. Further, the use of "may" when describing embodiments of the present invention relates to "one or more embodiments of the present invention." Expressions, such as "at least one of," when preceding a list of elements, modify the entire list of elements and do not modify the individual elements of the list. Also, the term "exemplary" is intended to refer to an example or illustration. As used herein, the terms "use," "using," and "used" may be considered synonymous with the terms "utilize," "utilizing," and "utilized," respectively. As used herein, the terms "substantially," "about," and similar terms are used as terms of approximation and not as terms of degree, and are intended to account for the inherent variations in measured or calculated values that would be recognized by those of ordinary skill in the art.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present invention. Similarly, the second element could also be termed the first element.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

The terminology used herein is for the purpose of describing particular example embodiments of the present invention and is not intended to be limiting of the described example embodiments of the present invention. As used herein, the singular forms "a" and "an" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components but do not preclude the presence or addition of one or more other features, integers, steps, operations, elements, components, and/or groups thereof.

Hereinafter, exemplary embodiments of the present disclosure will be described with reference to the accompanying drawings.

FIG. 1 is a plan view of a display device according to an exemplary embodiment.

Referring to FIG. 1, a display device 10 displays (e.g., is configured to display) a moving image and/or a still image. The display device 10 may refer to any electronic device providing (or including) a display screen. Examples of the display device 10 may include a television, a laptop computer, a monitor, a billboard, an Internet-of-Things (IoT) device, a mobile phone, a smartphone, a tablet personal computer (PC), an electronic watch, a smart watch, a watch phone, a head-mounted display, a mobile communication terminal, an electronic notebook, an electronic book, a portable multimedia player (PMP), a navigation device, a game machine, a digital camera, a camcorder, and the like, which provide a display screen.

The display device 10 includes a display panel which provides (or includes) a display screen. Examples of the display panel may include an inorganic light emitting diode display panel, an organic light emitting diode display panel, a quantum dot light emitting display panel, a plasma display panel, and a field emission display panel. In the following description, an inorganic light emitting diode display panel is described as an example of the display panel, but the present disclosure is not limited thereto, and aspects and features of the present disclosure may be applied to other display panels.

The shape of the display device 10 is not particularly limited. For example, the display device 10 may have a shape, such as a rectangular shape elongated in a horizontal direction, a rectangular shape elongated in a vertical direction, a square shape, a quadrilateral shape with rounded corners (or vertices), other polygonal shapes, and a circular shape. The shape of a display area DPA of the display device may be similar to the overall shape of the display device 10. An embodiment in which the display device 10 and the display area DPA both have a rectangular shape elongated in the horizontal direction is illustrated in FIG. 1.

The display device 10 may have the display area DPA and one or more non-display areas NDA. The display area DPA is an area where a screen is provided (e.g., where an image is displayed), and the non-display area NDA is an area where a screen is not present (e.g., where an image is not displayed). The display area DPA may also be referred to as an active region, and the non-display area NDA may also be referred to as a non-active (or inactive) region. The display area DPA may substantially occupy the center of the display device 10.

The display area DPA may include a plurality of pixels PX. The plurality of pixels PX may be arranged in a matrix. Each pixel PX may have a rectangular or square shape in a plan view. However, the present disclosure is not limited thereto, and each pixel PX may have a rhombic shape in which each side is inclined with respect to one direction. The pixels PX may be alternately arranged in a stripe arrangement or a pentile arrangement. In addition, each of the pixels PX may include one or more light emitting elements 30 (see, e.g., FIG. 2) that emit light in a wavelength band (e.g., in a specific wavelength band) to display a color (e.g., a specific color).

The non-display area NDA may be disposed around (e.g., may surround or extend around a periphery of) the display area DPA. The non-display area NDA may completely or partially surround the display area DPA. The display area DPA may have a rectangular shape, and the non-display area NDA may be disposed adjacent to four sides of the display area DPA. The non-display area NDA may form a bezel of the display device 10. Wirings or circuit drivers included in the display device 10 may be disposed in the non-display area NDA (or in each of the non-display areas NDA) or external devices may be mounted thereon.

Figure 2:
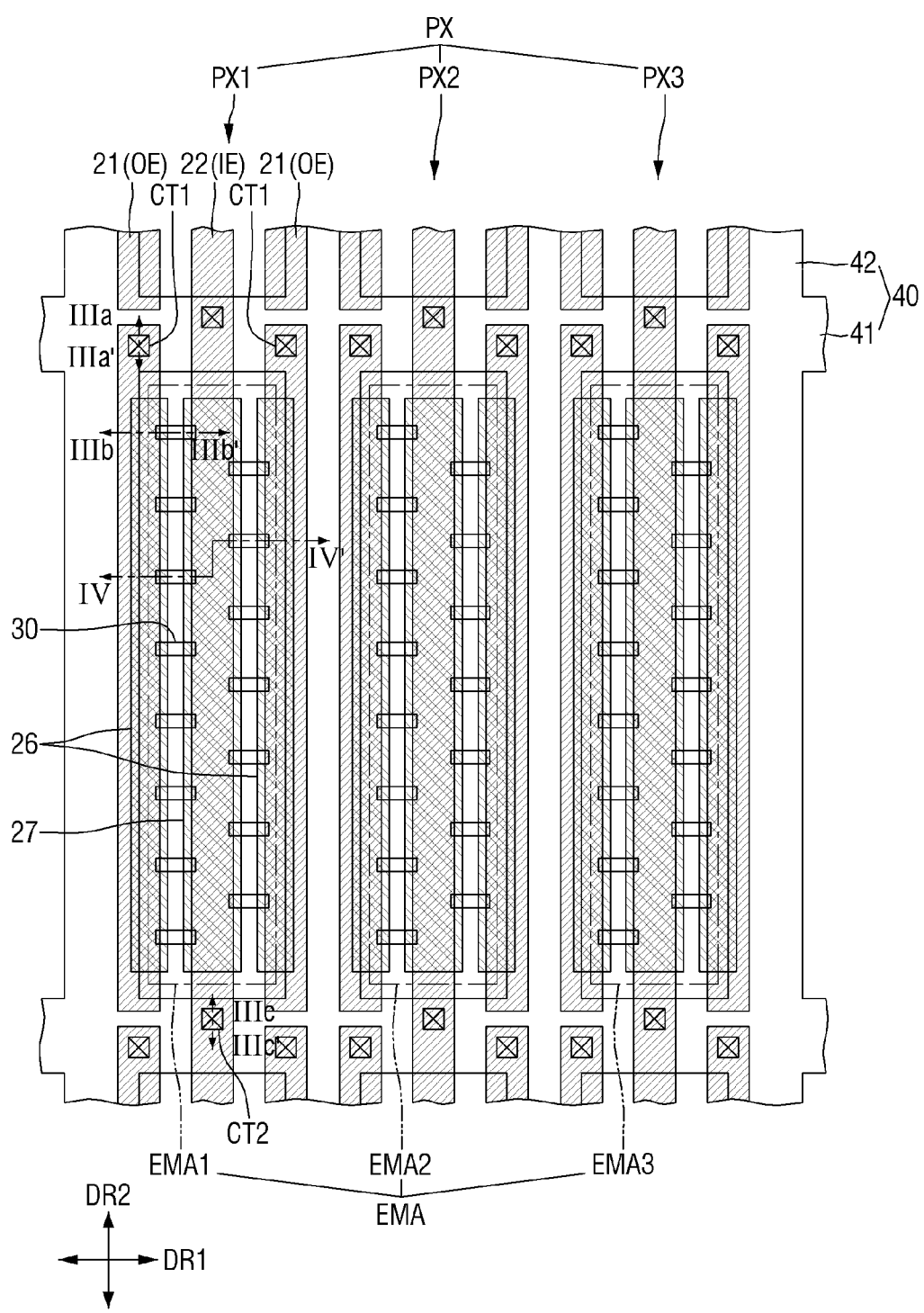
FIG. 2 is a plan view illustrating one pixel of a display device according to an exemplary embodiment.

FIG. 2 is a plan view illustrating one pixel PX of the display device 10 shown in FIG. 1 according to an exemplary embodiment.

Referring to FIG. 2, each of the plurality of pixels PX may include a plurality of sub-pixels PXn (n being an integer of 1 to 3). For example, one pixel PX may include a first sub-pixel PX1, a second sub-pixel PX2, and a third sub-pixel PX3. The first sub-pixel PX1 may emit light of a first color, the second sub-pixel PX2 may emit light of a second color, and the third sub-pixel PX3 may emit light of a third color. The first color may be blue, the second color may be green, and the third color may be red. However, the present disclosure is not limited thereto, and the sub-pixels PXn may emit light of the same color. In addition, although FIG. 2 illustrates an embodiment in which the pixel PX includes three sub-pixels PXn, the present disclosure is not limited thereto, and the pixel PX may include a greater number of sub-pixels PXn.

Each sub-pixel PXn of the display device 10 may include a region defined as an emission region EMA. The first sub-pixel PX1 may include a first emission region EMA1, the second sub-pixel PX2 may include a second emission region EMA2, and the third sub-pixel PX3 may include a third emission region EMA3. The emission region EMA may be defined as a region where the light emitting element 30 is disposed to emit light in a certain wavelength band. The light emitting element 30 includes an active layer 36 (see, e.g., FIG. 7), and the active layer 36 may emit light in a certain wavelength band without directionality (e.g., in all directions). The light emitted from the active layer 36 of the light emitting element 30 may be emitted in, among other directions, both lateral directions of the light emitting element 30. The emission region EMA may include an area in which the light emitting element 30 is disposed and an area adjacent to the light emitting element 30 to emit light from the light emitting element 30.

Without being limited thereto, the emission region EMA may also include an area in which light emitted from the light emitting element 30 is reflected or refracted by another member and then emitted from the display device 10. A plurality of light emitting elements 30 may be disposed in the respective sub-pixels PXn, and the emission region EMA may include an area where the light emitting elements 30 are disposed and an area adjacent thereto.

Each sub-pixel PXn of the display device 10 may include a non-emission region defined as a region other than the emission region EMA. The non-emission region may be a region in which the light emitting element 30 is not disposed and a region from which light is not emitted because light emitted from the light emitting element 30 does not reach it.

Figure 3:
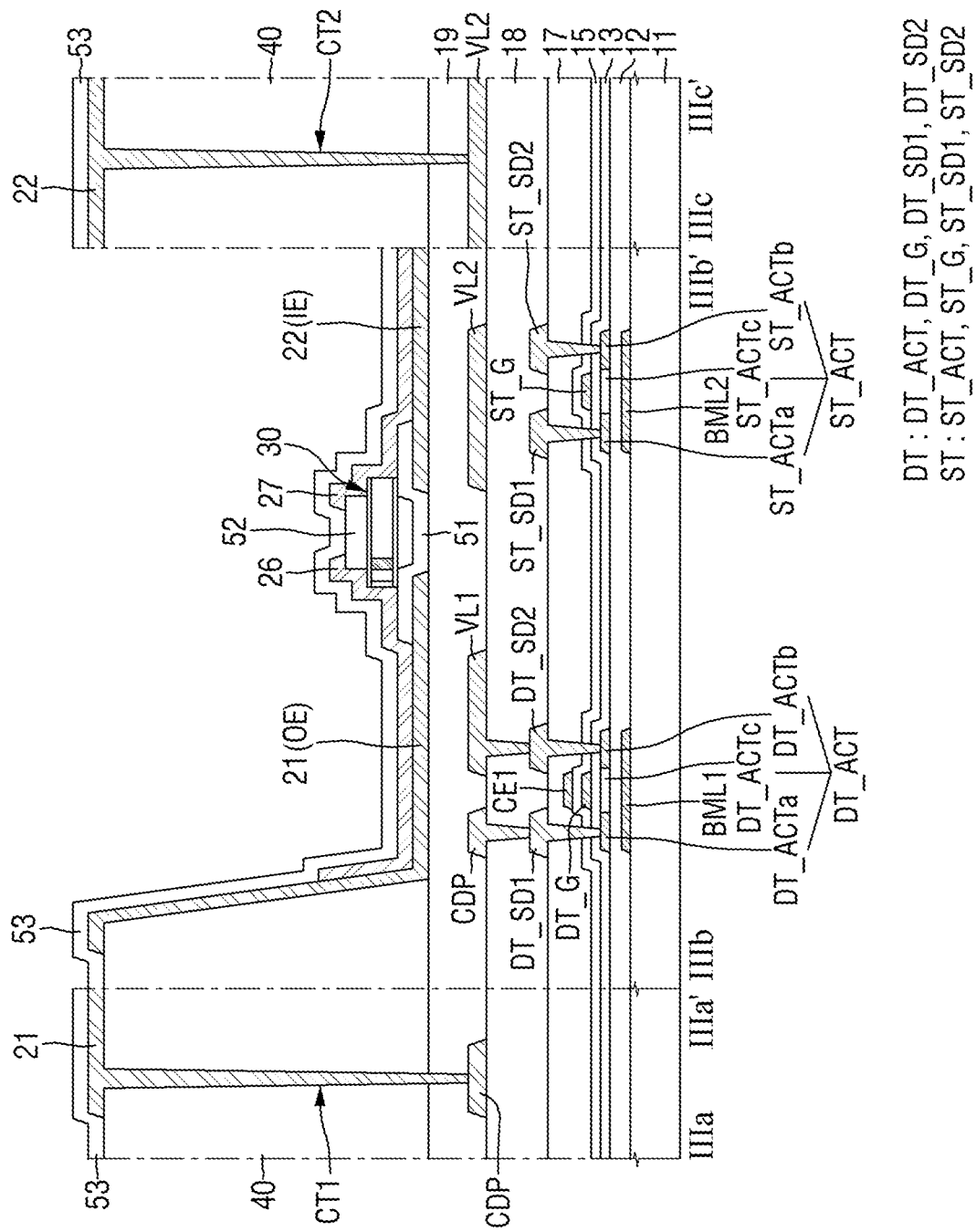
FIG. 3 is a cross-sectional view taken along the lines IIIa-IIIa', IIIb-IIIb', and IIIc-IIIc' of FIG. 2.
Figure 4:
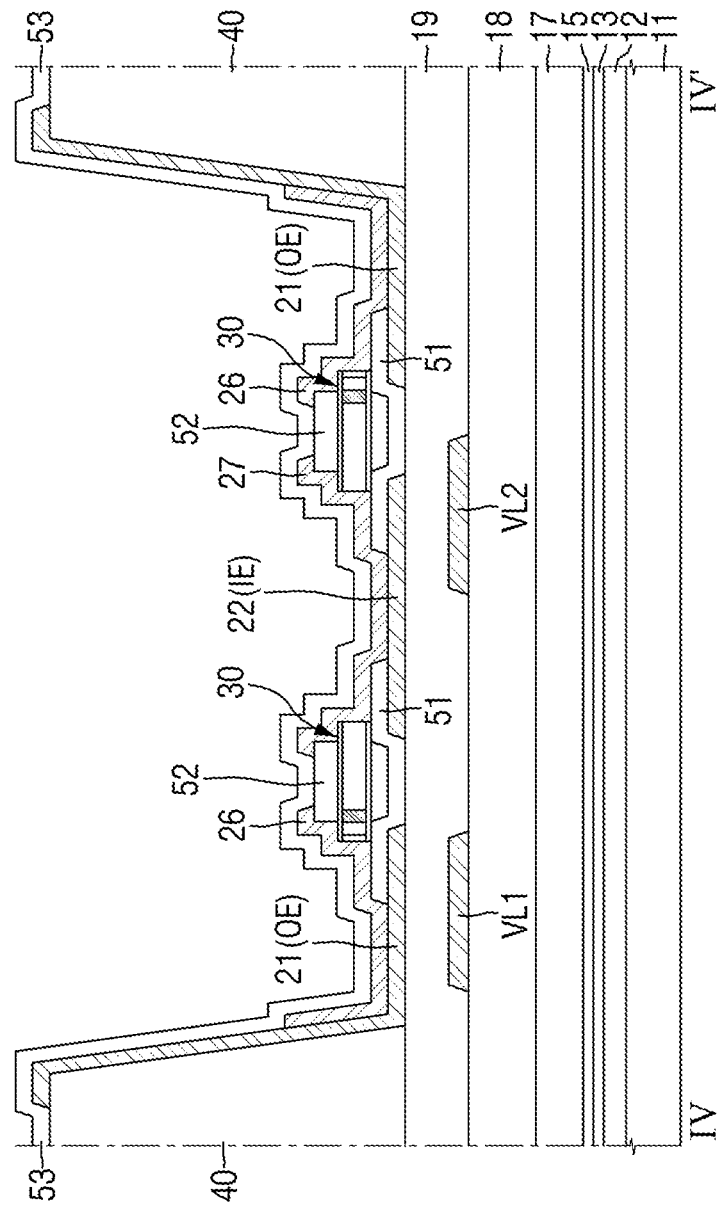
FIG. 4 is a cross-sectional view taken along the line IV-IV' of FIG. 2.

FIG. 3 is a cross-sectional view taken along the lines IIIa-IIIa', IIIb-IIIb', and IIIc-IIIc' of FIG. 2, and FIG. 4 is a cross-sectional view taken along the line IV-IV' of FIG. 2. FIGS. 3 and 4 only show a cross section of the first sub-pixel PX1 shown in FIG. 2, but the other pixels PX and/or sub-pixels PXn may have the same or substantially similar configuration as the first sub-pixel PX1. FIGS. 3 and 4 show a cross section passing through one end portion and the other end portion of the light emitting element 30 disposed in the first sub-pixel PX1.

Referring to FIGS. 3 and 4, in conjunction with FIG. 2, the display device 10 may include a first substrate (e.g., a substrate) 11 and a circuit element layer and a display element layer disposed on the first substrate 11. A semiconductor layer, a plurality of conductive layers, and a plurality of insulating layers are disposed on the first substrate 11, and these layers may form (or constitute) the circuit element layer and the display element layer, respectively. The plurality of conductive layers may include a first gate conductive layer, a second gate conductive layer, a first data conductive layer, a second data conductive layer, electrodes 21 and 22, and contact electrodes 26 and 27. The plurality of insulating layers may include a buffer layer 12, a first gate insulating layer 13, a first protective layer 15, a first interlayer insulating layer 17, a second interlayer insulating layer 18, a first planarization layer 19, a first insulating layer 51, a second insulating layer 52, a third insulating layer 53, and the like.

The first substrate 11 may be an insulating substrate. The first substrate 11 may include (or may be made of) an insulating material, such as glass, quartz, or polymer resin. In some embodiments, the first substrate 11 may be a rigid substrate but, in other embodiments, may be a flexible substrate which can be bent, folded, and/or rolled.

Light blocking layers BML1 and BML2 may be disposed on the first substrate 11. The light blocking layers BML1 and BML2 may include a first light blocking layer BML1 and a second light blocking layer BML2. The first light blocking layer BML1 and the second light blocking layer BML2 are disposed to overlap at least a first active material layer DT_ACT of a driving transistor DT and a second active material layer ST_ACT of a switching transistor ST, respectively. The light blocking layers BML1 and BML2 may include a material that blocks light, thereby preventing or substantially preventing light from entering (e.g., being incident to) the first and second active material layers DT_ACT and ST_ACT. For example, the first and second light blocking layers BML1 and BML2 may include (or may be formed of) an opaque metal material that blocks light transmission. However, the present disclosure is not limited thereto, and in some embodiments, the light blocking layers BML1 and BML2 may be omitted.

The buffer layer 12 may be entirely disposed on the first substrate 11 (e.g., may cover the entire first substrate 11) including the light blocking layers BML1 and BML2. The buffer layer 12 may be formed on the first substrate 11 to protect the transistors DT and ST of the pixel PX, which may be susceptible to moisture permeation, from moisture penetrating through the first substrate 11 and may perform a surface planarization function. The buffer layer 102 may include (or may be formed of) a plurality of inorganic layers that are alternately stacked. For example, the buffer layer 12 may have a multilayer structure in which inorganic layers including at least one of silicon oxide ($SiO_x$), silicon nitride ($SiN_x$), and silicon oxynitride (SiON) are alternately stacked.

The semiconductor layer is disposed on the buffer layer 12. The semiconductor layer may include the first active material layer DT_ACT of the driving transistor DT and the second active material layer ST_ACT of the switching transistor ST. These active material layers may be respectively disposed to partially overlap the gate electrodes DT_G and ST_G of the first gate conductive layer, which will be described in more detail below.

In an exemplary embodiment, the semiconductor layer may include polycrystalline silicon, monocrystalline silicon, an oxide semiconductor, or the like. The polycrystalline silicon may be formed by crystallizing amorphous silicon. When the semiconductor layer includes polycrystalline silicon, the first active material layer DT_ACT may include a first doped region DT_ACTa, a second doped region DT_ACTb, and a first channel region DT_ACTc. The first channel region DT_ACTc may be disposed between the first doped region DT_ACTa and the second doped region DT_ACTb. The second active material layer ST_ACT may include a third doped region ST_ACTa, a fourth doped region ST_ACTb, and a second channel region ST_ACTc. The second channel region ST_ACTc may be disposed between the third doped region ST_ACTa and the fourth doped region ST_ACTb. The first doped region DT_ACTa, the second doped region DT_ACTb, the third doped region ST_ACTa, and the fourth doped region ST_ACTb may be regions formed by doping some regions of the first active material layer DT_ACT and the second active material layer ST_ACT with impurities.

In another exemplary embodiment, the first active material layer DT_ACT and the second active material layer ST_ACT may include an oxide semiconductor. In such an embodiment, the doped regions of the first active material layer DT_ACT and the second active material layer ST_ACT may be conductor regions, respectively. The oxide semiconductor may be an oxide semiconductor including indium (In). In some embodiments, the oxide semiconductor may be indium tin oxide (ITO), indium zinc oxide (IZO), indium gallium oxide (IGO), indium zinc tin oxide (IZTO), indium gallium tin oxide (IGTO), indium gallium zinc tin oxide (IGZTO), or the like. However, the present disclosure is not limited thereto.

The first gate insulating layer 13 is disposed on the semiconductor layer and the buffer layer 12. The first gate insulating layer 13 may function as a gate insulating layer of the driving transistor DT and the switching transistor ST. The first gate insulating layer 13 may include (or may be formed of) an inorganic layer including an inorganic material, such as silicon oxide ($SiO_x$), silicon nitride ($SiN_x$), or silicon oxynitride (SiON), or a stacked structure including one or more of these or other suitable materials.

The first gate conductive layer is disposed on the first gate insulating layer 13. The first gate conductive layer may include a first gate electrode DT_G of the driving transistor DT and a second gate electrode ST_G of the switching transistor ST. The first gate electrode DT_G may be disposed to overlap the first channel region DT_ACTc of the first active material layer DT_ACT in the thickness direction, and the second gate electrode ST_G may be disposed to overlap the second channel region ST_ACTc of the second active material layer ST_ACT in the thickness direction.

The first gate conductive layer may be formed as a single layer or having a multilayer structure including (or made of) any one of molybdenum (Mo), aluminum (Al), chromium (Cr), gold (Au), titanium (Ti), nickel (Ni), neodymium (Nd), copper (Cu), or an alloy thereof. However, the present disclosure is not limited thereto.

The first protective layer 15 is disposed on the first gate conductive layer. The first protective layer 15 may be disposed to cover the first gate conductive layer to protect it. The first protective layer 15 may include (or may be formed of) an inorganic layer including an inorganic material, such as silicon oxide ($SiO_x$), silicon nitride ($SiN_x$), or silicon oxynitride (SiON), or a stacked structure including one or more of these or other suitable materials.

The second gate conductive layer is disposed on the first protective layer 15. The second gate conductive layer may include a first capacitive electrode CE1 of a storage capacitor disposed to at least partially overlap the first gate electrode DT_G in the thickness direction. The first capacitive electrode CE1 overlaps the first gate electrode DT_G in the thickness direction with the first protective layer 15 interposed therebetween, and a storage capacitor may be formed between the first capacitive electrode CE1 and the first gate electrode DT_G. The second gate conductive layer may be formed as a single layer or having a multilayer structure including (or made of) any one of molybdenum (Mo), aluminum (Al), chromium (Cr), gold (Au), titanium (Ti), nickel (Ni), neodymium (Nd), copper (Cu), or an alloy thereof. However, the present disclosure is not limited thereto.

The first interlayer insulating layer 17 is disposed on the second gate conductive layer. The first interlayer insulating layer 17 may function as an insulating layer between the second gate conductive layer and other layers disposed thereon. The first interlayer insulating layer 17 may include (or may be formed of) an inorganic layer including an inorganic material, such as silicon oxide ($SiO_x$), silicon nitride ($SiN_x$), or silicon oxynitride (SiON), or a stacked structure including one or more of these or other suitable materials.

The first data conductive layer is disposed on the first interlayer insulating layer 17. The first gate conductive layer may include a first source/drain electrode DT_SD1 and a second source/drain electrode DT_SD2 of the driving transistor DT and a first source/drain electrode ST_SD1 and the second source/drain electrode ST_SD2 of the switching transistor ST.

The first source/drain electrode DT_SD1 and the second source/drain electrode DT_SD2 of the driving transistor DT may contact the first doped region DT_ACTa and the second doped region DT_ACTb of the first active material layer DT_ACT through contact openings (e.g., contact holes) passing through the first interlayer insulating layer 17, the first protective layer 15, and the first gate insulating layer 13, respectively. The first source/drain electrode ST_SD1 and the second source/drain electrode ST_SD2 of the switching transistor ST may contact the third doped region ST_ACTa and the fourth doped region ST_ACTb of the second active material layer ST_ACT through contact openings (e.g., contact holes) passing through the first interlayer insulating layer 17, the first protective layer 15, and the first gate insulating layer 13, respectively. Further, the first source/drain electrode DT_SD1 of the driving transistor DT and the first source/drain electrode ST_SD1 of the switching transistor ST may be electrically connected to the first light blocking layer BML1 and the second light blocking layer BML2, respectively, through other contact openings (e.g., contact holes) in, for example, the buffer layer 12. With respect to the first source/drain electrodes DT_SD1, ST_SD1 and the second source/drain electrodes DT_SD2, ST_SD2 of the driving transistor DT and the switching transistor ST, when one electrode is a source electrode, the other electrode may be a drain electrode. However, the present disclosure is not limited thereto, and with respect to the first source/drain electrodes DT_SD1, ST_SD1 and the second source/drain electrodes DT_SD2, ST_SD2, when one electrode is a drain electrode, the other electrode may be a source electrode.

The first data conductive layer may be formed as a single layer or having a multilayer structure including (or made of) any one of molybdenum (Mo), aluminum (Al), chromium (Cr), gold (Au), titanium (Ti), nickel (Ni), neodymium (Nd), copper (Cu), or an alloy thereof. However, the present disclosure is not limited thereto.

The second interlayer insulating layer 18 may be disposed on the first data conductive layer. The second interlayer insulating layer 18 is disposed entirely on the first interlayer insulating layer 17 (e.g., entirely covering the first interlayer insulating layer 17) to cover the first data conductive layer and may protect the first data conductive layer. The second interlayer insulating layer 18 may include (or may be formed of) an inorganic layer including an inorganic material, such as silicon oxide ($SiO_x$), silicon nitride ($SiN_x$), or silicon oxynitride (SiON), or a stacked structure including one or more of these or other suitable materials.

The second data conductive layer is disposed on the second interlayer insulating layer 18. The second data conductive layer may include a first voltage line VL1, a second voltage line VL2, and a first conductive pattern CDP. The first voltage line VL1 may be applied with a high potential voltage (e.g., a first source voltage VDD) supplied to the driving transistor DT, and the second voltage line VL2 may be applied with a low potential voltage (e.g., a second source voltage VSS) supplied to a second electrode 22. Also, during the manufacturing process of the display device 10, the second voltage line VL2 may be applied with an alignment signal to align the light emitting element 30.

The first conductive pattern CDP may be electrically connected to the first source/drain electrode DT_SD1 of the driving transistor DT through a contact opening (e.g., a contact hole) formed in the second interlayer insulating layer 18. The first conductive pattern CDP may also contact a first electrode 21, which is to described in more detail below, and the driving transistor DT may transfer the first source voltage VDD applied from the first voltage line VL1 to the first electrode 21 through the first conductive pattern CDP. Although an embodiment in which the second data conductive layer includes one second voltage line VL2 and one first voltage line VL1 is illustrated, the present disclosure is not limited thereto. The second data conductive layer may include a greater number of voltage lines (e.g., a greater number of first voltage lines VL1 and second voltage lines VL2).

The second data conductive layer may be formed as a single layer or having a multilayer structure including (or made of) any one of molybdenum (Mo), aluminum (Al), chromium (Cr), gold (Au), titanium (Ti), nickel (Ni), neodymium (Nd), copper (Cu), or an alloy thereof. However, the present disclosure is not limited thereto.

The first planarization layer 19 is disposed on the second data conductive layer. The first planarization layer 19 may include an organic insulating material, for example, an organic material, such as polyimide (PI), to perform a surface planarization function (e.g., to provide a planar upper surface).

A first bank 40, first and second electrodes 21 and 22, the light emitting element 30, and a plurality of contact electrodes 26 and 27 are disposed on the first planarization layer 19. In addition, a plurality of insulating layers 51, 52, and 53 may be further disposed on the first planarization layer 19.

The first bank 40 may be disposed on the first planarization layer 19. For example, the first bank 40 may be disposed directly on the first planarization layer 19 to surround (e.g. to surround or extend around a periphery of) the emission region EMA in which the light emitting elements 30 are disposed. The first bank 40 may be disposed to extend in a first direction DR1 and a second direction DR2, thereby forming a grid pattern over the entire surface of the display area DPA. In an exemplary embodiment, the first bank 40 may include a first extension portion 41 extending in the first direction DR1 and a second extension portion 42 crossing (or intersecting) the first extension portion 41 and extending in the second direction DR2. The first bank 40 may be disposed at the boundary of the neighboring sub-pixel PXn (e.g., may extend between two adjacent sub-pixels PXn). FIG. 4 illustrates a cross section of the second extension portion 42 of the first bank 40 extending in the second direction DR2, which is disposed at the boundary between the first sub-pixel PX1 and a neighboring (or adjacent) sub-pixel PXn adjacent thereto in the first direction DR1 (e.g., the second sub-pixel PX2).

The first bank 40 may have a structure in which at least a portion thereof protrudes from the top surface of the first planarization layer 19. The protruding portion of the first bank 40 may have an inclined side surface, and at least a portion of the electrodes 21 and 22 may be disposed on the inclined side surface, as will be described in more detail below. The light emitted from the light emitting element 30 disposed between the electrodes 21 and 22 may proceed toward the inclined side surface of the first bank 40 and may be reflected by the electrodes 21 and 22 that are disposed on the first bank 40 to be emitted in an upward direction with respect to the first planarization layer 19. For example, the first bank 40 may surround the emission region EMA where the light emitting element 30 is disposed and may distinguish the boundary of neighboring (or adjacent) sub-pixels PXn. The first bank 40 may also function as a reflective partition wall that reflects light emitted from the light emitting element 30 upwardly. In addition, as described in more detail below, the first bank 40 may prevent ink from overflowing to adjacent sub-pixels PXn during an inkjet printing process for disposing the light emitting element 30 during the manufacturing process of the display device 10. The first bank 40 may separate inks in which different light emitting elements 30 are dispersed for different sub-pixels PXn so they are not mixed with each other. The side surface of the first bank 40 may be inclined in a linear shape (e.g., may have a linear slope) but is not limited thereto. In some embodiments, the outer surface of the first bank 40 may have a curved semicircle or semi-ellipse shape. In an exemplary embodiment, the first bank 40 may include an organic insulating material, such as polyimide (PI), but is not limited thereto.

The electrodes 21 and 22 are disposed on the first planarization layer 19. The electrodes 21 and 22 may include the first electrode 21 and the second electrode 22. The first electrode 21 and the second electrode 22 may extend in the second direction DR2 and may be disposed to be spaced from each other and face each other in the first direction DR1.

The first electrode 21 may extend in the second direction DR2 within each sub-pixel PXn and may be spaced apart from other first electrodes 21 (e.g., from first electrodes 21 of adjacent sub-pixels PXn) at the boundary with other sub-pixels PXn in the second direction DR2. In some embodiments, the first electrodes 21 disposed in the respective sub-pixels PXn that are adjacent to each other in the second direction DR2 may be spaced apart along a portion of the first bank 40. The first electrode 21 may be electrically connected to the driving transistor DT through a first contact opening (e.g., a first contact hole) CT1 at the boundary with the sub-pixel PXn adjacent thereto in the second direction DR2. For example, the first electrode 21 may be disposed such that at least a portion thereof overlaps the first extension portion 41 of the first bank 40 and may contact the first conductive pattern CDP through the first contact opening CT1, which passes through the first planarization layer 19. The first electrode 21 may be electrically connected to the first source/drain electrode DT_SD1 of the driving transistor DT through the first conductive pattern CDP.

The second electrode 22 may extend in the second direction DR2 and may be disposed beyond (e.g., may extend beyond or outside of) the boundary of the sub-pixel PXn adjacent thereto in the second direction DR2. In some embodiments, one second electrode 22 may be disposed across a plurality of sub-pixels PXn adjacent each other in the second direction DR2. The second electrode 22 may partially overlap the first bank 40 at the boundary with the sub-pixel PXn adjacent in the second direction DR2 and may be electrically connected to the second voltage line VL2 through a second contact opening (e.g., a second contact hole) CT2. For example, the second electrode 22 may be disposed to overlap the first extension portion 41 of the first bank 40 and may contact the second voltage line VL2 through the second contact opening CT2 passing through the first planarization layer 19. The second source voltage may be applied to the second electrode 22 through the second voltage line VL2. Although the second electrode 22 is illustrated as being electrically connected to the second voltage line VL2 through the second contact opening CT2 disposed at the boundary of each sub-pixel PXn, the present disclosure is not limited thereto. In some embodiments, one second contact opening CT2 may be disposed for each (e.g., in each) of the plurality of sub-pixels PXn. In addition, the first contact opening CT1 and the second contact opening CT2 may be disposed so as not to overlap (e.g., to be offset from) the first bank 40 within an area surrounded by (e.g., bounded by) the first bank 40.

The electrodes 21 and 22 may be electrically connected to the light emitting elements 30 and may receive (e.g., may be applied with) a reference voltage (e.g., a predetermined voltage) to allow the light emitting elements 30 to emit light (e.g., the light emitting elements 30 may emit light in response to a voltage applied thereto). For example, the electrodes 21 and 22 are respectively electrically connected to the light emitting elements 30 through the contact electrodes 26 and 27, which are described in more detail below, and the electrical signals applied to the electrodes 21 and 22 may be transferred to the light emitting elements 30 through the contact electrodes 26 and 27.

In an exemplary embodiment, a separate first electrode 21 may be provided in each sub-pixel PXn, and the second electrode 22 may be formed commonly along each sub-pixel PXn. One of the first electrode 21 and the second electrode 22 may be electrically connected to an anode electrode of the light emitting element 30, and the other one thereof may be electrically connected to a cathode electrode of the light emitting element 30. However, the present disclosure is not limited thereto, and the opposite may be applied.

Further, each of the electrodes 21 and 22 may be used to form an electric field in the sub-pixel PXn to align the light emitting element 30. The light emitting element 30 may be disposed (e.g., aligned) between the first electrode 21 and the second electrode 22 by an electric field formed between the first electrode 21 and the second electrode 22. As will be described in more detail below, the light emitting elements 30 may be sprayed on (e.g., deposited on) the first electrode 21 and the second electrode 22 in a state of being dispersed in ink through an inkjet process and may be aligned between the first electrode 21 and the second electrode 22 by applying an alignment signal therebetween, thereby applying a dielectrophoretic force to the light emitting elements 30.

Each of the electrodes 21 and 22 may include a transparent conductive material. For example, each of the electrodes 21 and 22 may include a material, such as indium tin oxide (ITO), indium zinc oxide (IZO), and indium tin zinc oxide (ITZO), but is not limited thereto. In some embodiments, each of the electrodes 21 and 22 may include a conductive material having high reflectivity. For example, each of the electrodes 21 and 22 may include a highly-reflective material, for example, a metal, such as silver (Ag), copper (Cu), or aluminum (Al). In such an embodiment, each electrode 21, 22 may reflect light that is emitted from the light emitting element 30 toward the side surface of the first bank 40 in the upward direction of each sub-pixel PXn.

Without being limited thereto, each electrode 21, 22 may have a structure in which at least one transparent conductive material and at least one highly reflective metal layer are stacked, or may be formed as one layer including them (e.g., as one layer include both materials). In an exemplary embodiment, each electrode 21, 22 may have a stacked structure, such as ITO/Ag/ITO, ITO/Ag/IZO, or ITO/Ag/ITZO/IZO, or may be an alloy including aluminum (Al), nickel (Ni), lanthanum (La), or the like.

Although an embodiment in which two first electrodes 21 and one second electrode 22 are disposed in each sub-pixel PXn is illustrated, the present disclosure is not limited thereto. In some embodiments, a greater number of the first electrodes 21 and the second electrodes 22 may be disposed in each sub-pixel PXn. In addition, the first electrode 21 and the second electrode 22 disposed in each sub-pixel PXn may not necessarily have a shape extending in one direction, and the first electrode 21 and the second electrode 22 may be arranged in various structures (or having various shapes and/or arrangements). For example, the first electrode 21 and the second electrode 22 may have a partially curved or bent shape, and one electrode may be disposed to surround (e.g., extend around a periphery of) the other electrode. At least some regions of the first electrode 21 and the second electrode 22 are spaced apart from each other to face each other. Accordingly, an arrangement structure or shape thereof is not particularly limited as long as a region where the light emitting element 30 is to be disposed is formed therebetween.

The display device 10 may be configured such that at least some of the plurality of electrodes 21 and 22 are disposed to overlap the first bank 40. For example, the second electrode 22 may be spaced apart from the second extension portion 42 of the first bank 40 and extend in the second direction DR2 from the center of the sub-pixel PXn. The first electrodes 21 may be disposed to overlap the first extension portion 41 of the first bank 40 along the second direction DR2.

According to an exemplary embodiment, the sub-pixels PXn of the display device 10 may include internal electrodes IE disposed at or adjacent to the center (e.g., the center of the corresponding sub-pixel PXn) and external electrodes OE spaced apart from the internal electrodes IE (e.g., at a periphery of the corresponding sub-pixel PXn). An interval (e.g., a space) between the external electrodes OE and the center being greater than an interval between the internal electrodes IE and the center. From among the plurality of electrodes disposed in each sub-pixel PXn, at least a portion of the external electrodes OE may be disposed on the second extension portion 42 of the first bank 40, and the internal electrodes IE may be disposed so as not to overlap (e.g., may be offset from) the second extension portion 42 of the first bank 40.

As the inner electrode IE and the outer electrode OE are disposed respectively to extend in the second direction DR2, they may partially overlap the first extension portion 41 of the first bank 40. However, the external electrode OE may overlap the second extension portion 42 of the first bank 40 and may extend in the second direction DR2, and the internal electrode IE may be spaced apart from the external electrode OE2 so as not to overlap the second extension portion 42. In a cross-sectional view, at least a portion of the outer electrode OE may be disposed on the inclined side surface of the first bank 40, and the other portion thereof may be disposed directly on the first planarization layer 19, while the lower surface of the inner electrode IE may be disposed directly on the first planarization layer 19 so as not to overlap the first bank 40.

For example, referring to FIG. 4, at least some of the plurality of first electrodes 21 may be the external electrodes OE disposed on the second extension portion 42 of the first bank 40, and the second electrode 22 may be the internal electrode IE that does not overlap the second extension portion 42. However, the present disclosure is not limited thereto, and in some embodiments, a greater number of internal electrodes IE may be included. In some embodiments, one first electrode 21 and one second electrode 22 are respectively external electrodes OE, and the plurality of first electrodes 21 and second electrodes 22 may be internal electrodes IE.

According to an exemplary embodiment, the inner electrode IE and the outer electrode OE may have substantially the same width. The internal electrode IE and the external electrode OE may be arranged at different positions in each sub-pixel PXn and may have substantially the same shape. However, the present disclosure is not limited thereto. In some embodiments, some of the electrodes 21, 22 may be formed to have a larger width than other electrodes 21, 22.

Figure 5:
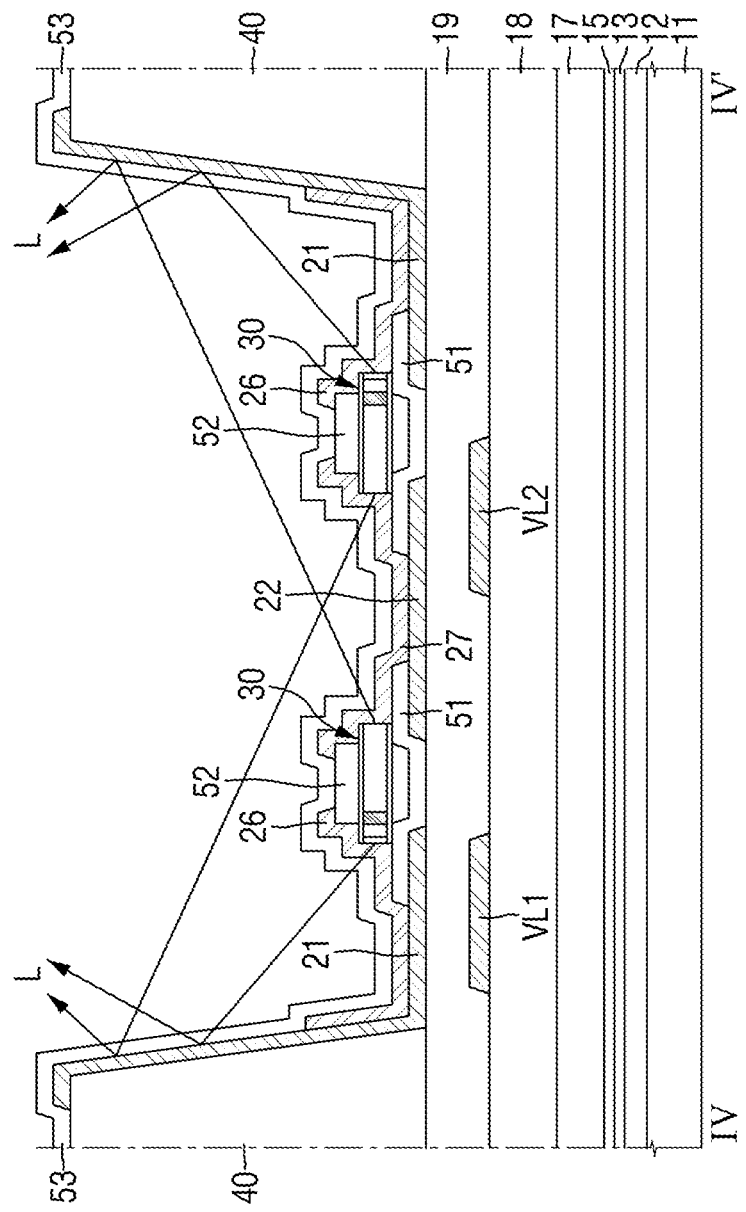
FIG. 5 is a schematic diagram illustrating paths of light emitted from a light emitting element of a display device according to an exemplary embodiment.

FIG. 5 is a schematic diagram illustrating light emitted from a light emitting element of a display device according to an exemplary embodiment proceeds.

Referring to FIG. 5, as will be described in more detail below, a plurality of light emitting elements 30 are disposed between the electrodes 21 and 22. The light emitting element 30 may have a shape extending in one direction, and the light emitting elements 30 disposed on the electrodes 21 and 22 may be arranged such that the extending direction thereof is parallel (or substantially parallel) to the top surface of the first substrate 11. The light emitting element 30 may emit light L along the extending direction. The light L emitted from the light emitting element 30 may travel in a direction parallel to (or substantially parallel to) the top surface of the first substrate 11.

The light L emitted from the light emitting element 30 may travel toward the inclined side surface of the first bank 40. The electrodes 21 and 22 may include a material having high reflectivity, and the light L directed toward (e.g., incident on) the inclined side surface of the first bank 40 may be reflected by the electrodes 21 and 22 to be emitted in the upward direction with respect to the first planarization layer 19. The display device 10 according to an exemplary embodiment may include the first bank 40 that distinguishes the boundary of the neighboring sub-pixel PXn and reflects light emitted from the light emitting element 30. The display device 10 may reduce the number of reflective partition walls disposed in each sub-pixel PXn by placing some electrodes 21 and 22, for example, only the external electrode OE, on the first bank 40. In addition, the unit area occupied by each sub-pixel PXn may be decreased because the external electrode OE is disposed across the boundary of the sub-pixel PXn. For example, the display device 10 may implement a high-resolution display device by including a greater number of pixels PX or sub-pixels PXn per unit area while simplifying the manufacturing process.

Referring back to FIGS. 2 to 4, the first insulating layer 51 is disposed on the first planarization layer 19, the first electrode 21, and the second electrode 22. The first insulating layer 51 is disposed to partially cover the first electrode 21 and the second electrode 22. For example, the first insulating layer 51 may include a region between the first electrode 21 and the second electrode 22 and may be disposed to cover a portion of the top surface of the first electrode 21 and the second electrode 22. The first insulating layer 51 may be disposed to partially cover a portion of the first electrode 21 directly disposed on the first planarization layer 19 and so as not to cover a portion of the first electrode 21 disposed on the first bank 40. In addition, the first insulating layer 51 may be disposed to cover most of the top surface of the second electrode 22 and to expose a portion of the top surface of the second electrode 22. The first insulating layer 51 may be substantially formed entirely on the first planarization layer 19. As the first insulating layer 51 is disposed between the first electrode 21 and the second electrode 22, a linear pattern may be formed over the entire display area DPA.

In an exemplary embodiment, the first insulating layer 51 may be formed to have a step such that a portion of the top surface thereof is recessed between the first electrode 21 and the second electrode 22. In some embodiments, the first insulating layer 51 may include an inorganic insulating material, and a portion of the top surface of the first insulating layer 51 disposed to cover the first electrode 21 and the second electrode 22 may be recessed due to the step of the member disposed therebelow. The light emitting element 30 disposed on the first insulating layer 51 between the first electrode 21 and the second electrode 22 may form an empty space with respect to the recessed top surface of the first insulating layer 51. The light emitting element 30 may be disposed to be partially spaced from the top surface of the first insulating layer 51, and a material forming the contact electrodes 26 and 27, to be described in more detail below, may be filled in the space. However, the present disclosure is not limited thereto. The first insulating layer 51 may have a flat (e.g., a planar) top surface such that the light emitting element 30 is disposed thereon.

The first insulating layer 51 may protect the first electrode 21 and the second electrode 22 and insulate them from each other. Further, the light emitting element 30 disposed on the first insulating layer 51 may not be damaged by direct contact with other members (e.g., by direct contact with the first and second electrodes 21 and 22). However, the shape and structure of the first insulating layer 51 are not limited thereto.

The light emitting element 30 may be disposed between the electrodes 21 and 22. In an exemplary embodiment, the light emitting element 30 may have a shape extending in one direction, and the plurality of light emitting elements 30 may be disposed to be spaced apart from each other and may be arranged substantially parallel to each other. The interval between the light emitting elements 30 is not particularly limited. In some embodiments, a plurality of light emitting elements 30 may be arranged adjacently (e.g., arranged adjacent each other) to form a group, and the other plurality of light emitting elements 30 may be grouped while being spaced apart at an interval (e.g., a regular interval). In other embodiments, however, the light emitting elements 30 may be arranged with non-uniform density. In addition, the extending direction of the electrodes 21 and 22 may be substantially perpendicular to the extending direction of the light emitting element 30. However, the present disclosure is not limited thereto, and in other embodiments, the light emitting element may be disposed obliquely without being perpendicular to the extending direction of the electrodes 21 and 22.

The light emitting elements 30 according to an exemplary embodiment may include the active layer 36 (see, e.g., FIG. 7) including (or containing) different materials to emit light having different wavelength bands to the outside. The display device 10 may include light emitting elements 30 that emit light of different wavelength bands. For example, the light emitting element 30 in the first sub-pixel PX1 may include an active layer 36 that emits light of a first color having a central wavelength band of a first wavelength, the light emitting element 30 in the second sub-pixel PX2 may include an active layer 36 that emits light of a second color having a central wavelength band of a second wavelength, and the light emitting element 30 in the third sub-pixel PX3 may include an active layer 36 that emits light of a third color having a central wavelength band of a third wavelength.

Accordingly, light of the first color, light of the second color, and light of the third color may be emitted from the first sub-pixel PX1, the second sub-pixel PX2, and the third sub-pixel PX3, respectively. In some embodiments, the first color light may be blue light having a central wavelength band in a range of about 450 nm to about 495 nm, the second color light may be green light having a central wavelength band in a range of about 495 nm to about 570 nm, and the third color light may be red light having a central wavelength band in a range of about 620 nm to about 752 nm. However, the present disclosure is not limited thereto. In some embodiments, the first sub-pixel PX1, the second sub-pixel PX2, and the third sub-pixel PX3 may include the light emitting elements 30 of the same type to emit light of substantially the same color.

The light emitting element 30 may be disposed on the first insulating layer 51 between the electrodes 21 and 22. For example, at least one end portion of the light emitting element 30 may be disposed on the first electrode 21 or the second electrode 22. As shown in, for example, FIG. 4, the extension length of the light emitting element 30 may be longer than the distance between the first electrode 21 and the second electrode 22, and ends of the light emitting element 30 may be respectively disposed on the first electrode 21 and the second electrode 22. However, the present disclosure is not limited thereto, and in some embodiments, only one end portion of the light emitting element 30 may be disposed on the electrodes 21 and 22, or both ends of the light emitting element 30 may not be disposed on the electrodes 21 and 22. Even when the light emitting element 30 is not disposed on the electrodes 21 and 22, both ends of the light emitting element 30 may be electrically connected to the electrodes 21 and 22 through the contact electrodes 26 and 27, to be described in more detail below. In some embodiments, the plurality of light emitting elements 30 may be at least partially disposed between the first electrode 21 and the second electrode 22, and both ends thereof may be electrically connected to the electrodes 21 and 22.

The light emitting element 30 may be provided with a plurality of layers disposed in a direction perpendicular to the top surface of the first substrate 11 or the first planarization layer 19. According to an exemplary embodiment, the light emitting element 30 may have a shape extending in one direction and may have a structure in which a plurality of semiconductor layers are sequentially arranged in one direction (e.g., are stacked on each other). The light emitting element 30 of the display device may be disposed such that its extending direction is parallel to the first planarization layer 19, and the plurality of semiconductor layers included in the light emitting element may be sequentially arranged along a direction parallel to the top surface of the first planarization layer 19. However, the present disclosure is not limited thereto. In some embodiments, when the light emitting element 30 has a different structure, a plurality of layers may be arranged in a direction perpendicular to the first planarization layer 19.

Further, ends of the light emitting element 30 may contact the contact electrodes 26 and 27, respectively. According to an exemplary embodiment, because the light emitting element 30 does not have an insulating layer 38 formed on one end surface thereof in the extending direction (see, e.g., FIG. 7), thereby exposing a portion of the semiconductor layer, the exposed semiconductor layer may contact the contact electrodes 26 and 27, to be described in more detailed below. However, the present disclosure is not limited thereto. In some embodiments, at least a portion of the insulating layer 38 of the light emitting element 30 may be removed, such that the side surfaces at both ends of the semiconductor layers may be partially exposed. The side surfaces of the exposed semiconductor layer may directly contact the contact electrodes 26 and 27.

The second insulating layer 52 may be partially disposed on (e.g., may cover a part of) the light emitting element 30 and between the first electrode 21 and the second electrode 22. The second insulating layer 52 may be disposed to partially surround the outer surface of (e.g., may extend around a periphery of) the light emitting element 30. A portion of the second insulating layer 52 disposed on the light emitting element 30 may have a shape extending in the second direction DR2 between the first electrode 21 and the second electrode 22 in a plan view. For example, the second insulating layer 52 may form a linear or island-shaped pattern in each sub-pixel PXn.

The second insulating layer 52 may be disposed on the light emitting element 30 to expose one end portion and the other end portion of the light emitting element 30. The exposed ends of the light emitting element 30 may contact the contact electrodes 26 and 27, to be described in more detail below. The second insulating layer 52 (e.g., the shape of the second insulating layer 52) may be formed by a patterning process using a material forming the second insulating layer 52 in a conventional mask process. The mask for forming the second insulating layer 52 may have a width smaller than the length of the light emitting element 30, and the material forming the second insulating layer 52 may be patterned such that both ends of the light emitting element 30 are exposed. However, the present disclosure is not limited thereto.

The second insulating layer 52 may function to protect the light emitting element 30 and also to fix the light emitting element 30 in a manufacturing process of the display device 10. Further, in an exemplary embodiment, a portion of the material of the second insulating layer 52 may be disposed between the bottom surface of the light emitting element 30 and the first insulating layer 51. As described above, the second insulating layer 52 may fill a space between the first insulating layer 51 and the light emitting element 30 formed during the manufacturing process of the display device 10. Accordingly, the second insulating layer 52 may be disposed to surround the outer surface of (e.g., surround a part of the outer surface of) the light emitting element 30 to protect the light emitting element 30 and also to fix the light emitting element 30 during the manufacturing process of the display device 10.

The plurality of contact electrodes 26 and 27 are disposed on the first electrode 21, the second electrode 22, and the second insulating layer 52. The contact electrodes 26 and 27 may include a first contact electrode 26 disposed on the first electrode 21 and contacting one end portion of the light emitting element 30 and a second contact electrode 27 disposed on the second electrode 22 and contacting the other end portion of the light emitting element 30.

The first contact electrode 26 and the second contact electrode 27 may extend in the second direction DR2 within each sub-pixel PXn and may be arranged to face each other in the first direction DR1. The first contact electrode 26 and the second contact electrode 27 may be spaced apart from each other to face each other in a region where the light emitting elements 30 are disposed, for example, between the first electrode 21 and the second electrode 22. In some embodiments, the plurality of contact electrodes 26 and 27 may form a linear pattern in each sub-pixel PXn.

In an exemplary embodiment, from among the plurality of contact electrodes 26 and 27, the contact electrodes 26 and 27 disposed on the external electrode OE may be disposed to partially overlap the first bank 40. The contact electrodes 26 and 27 disposed on the internal electrode IE may be disposed in a region surrounded by the first bank 40 and spaced apart from the boundary of the neighboring sub-pixel PXn. For example, the first contact electrode 26 is disposed on the first electrode 21, which is the external electrode OE, and may partially overlap the second extension portion 42 of the first bank 40, and the second contact electrode 27 is disposed on the second electrode 22, which is the internal electrode IE, and may not overlap the first bank 40. However, the present disclosure is not limited thereto.

The first contact electrode 26 and the second contact electrode 27 may contact the exposed top surfaces of the first electrode 21 and the second electrode 22, respectively, at an area where the first insulating layer 51 is not disposed.

Further, the contact electrodes 26 and 27 may contact both ends of the light emitting element 30. In some embodiments, the contact electrodes 26 and 27 may include a conductive material, and the light emitting element 30 may be electrically connected to each of the electrodes 21 and 22 via contact with the contact electrodes 26 and 27. As described above, a plurality of semiconductor layers at both ends of the light emitting element 30 may be partially exposed, and the contact electrodes 26 and 27 may directly contact the exposed semiconductor layer. As the first contact electrode 26 and the second contact electrode 27 extend in the second direction DR2, they may be disposed to partially surround the outer surfaces of the plurality of light emitting elements 30 disposed between the electrodes 21 and 22.

In an exemplary embodiment, the width of the first contact electrode 26 may be smaller than the width of the second contact electrode 27. The first contact electrode 26 may cover one side of the first electrode 21, which is the external electrode OE, and may contact one end portion of the light emitting element 30. The second contact electrode 27 may cover both sides of the second electrode 22, which is the internal electrode IE, and may contact the other end portion of the light emitting element 30. However, the present disclosure is not limited thereto. In some embodiments, the first contact electrode 26 and the second contact electrode 27 may have the same width, and a plurality of second contact electrodes 27 may be disposed on the second electrode 22. Each of the second contact electrodes 27 may cover one side of the second electrode 22 and may contact the other end portion of the light emitting element 30.

Although an embodiment in which two first contact electrodes 26 and one second contact electrode 27 are disposed in one sub-pixel PXn is shown, the present disclosure is not limited thereto. The number of the first contact electrodes 26 and the second contact electrodes 27 may vary depending on the number of the first electrodes 21 and the second electrodes 22 disposed in each sub-pixel PXn.

The contact electrodes 26 and 27 may include a conductive material. For example, the contact electrodes 26 and 27 may include ITO, IZO, ITZO, aluminum (Al), or the like. As an example, the contact electrodes 26 and 27 may include a transparent conductive material, and light emitted from (or emitted by) the light emitting element 30 may pass through the contact electrodes 26 and 27 and proceed toward the electrodes 21 and 22. Each of the electrodes 21 and 22 may include a material having high reflectivity, and the electrodes 21 and 22 placed on (e.g., on or disposed on) the inclined side surface of the first bank 40 may reflect incident light in the upward direction of the first substrate 11. However, the present disclosure is not limited thereto.

The third insulating layer 53 may be disposed entirely on (e.g., may entire cover) the first substrate 11. The third insulating layer 53 may function to protect the members disposed on the first substrate 11 against the external environment.

Each of the first insulating layer 51, the second insulating layer 52, and the third insulating layer 53 described above may include an inorganic insulating material and/or an organic insulating material. In an exemplary embodiment, the first insulating layer 51, the second insulating layer 52, and the third insulating layer 53 may include an inorganic insulating material, such as silicon oxide ($SiO_x$), silicon nitride ($SiN_x$), silicon oxynitride ($SiO_xN_y$), aluminum oxide ($Al_2O_3$), aluminum nitride (AlN), and the like. In some embodiments, they may include (e.g., may also include) an organic insulating material, such as an acrylic resin, an epoxy resin, a phenolic resin, a polyamide resin, a polyimide resin, an unsaturated polyester resin, a polyphenylene resin, polyphenylene sulfide resin, benzocyclobutene, a cardo resin, a siloxane resin, a silsesquioxane resin, polymethylmethacrylate, polycarbonate, a polymethylmethacrylate-polycarbonate synthetic resin, and the like. However, the present disclosure is not limited thereto.

Figure 6:
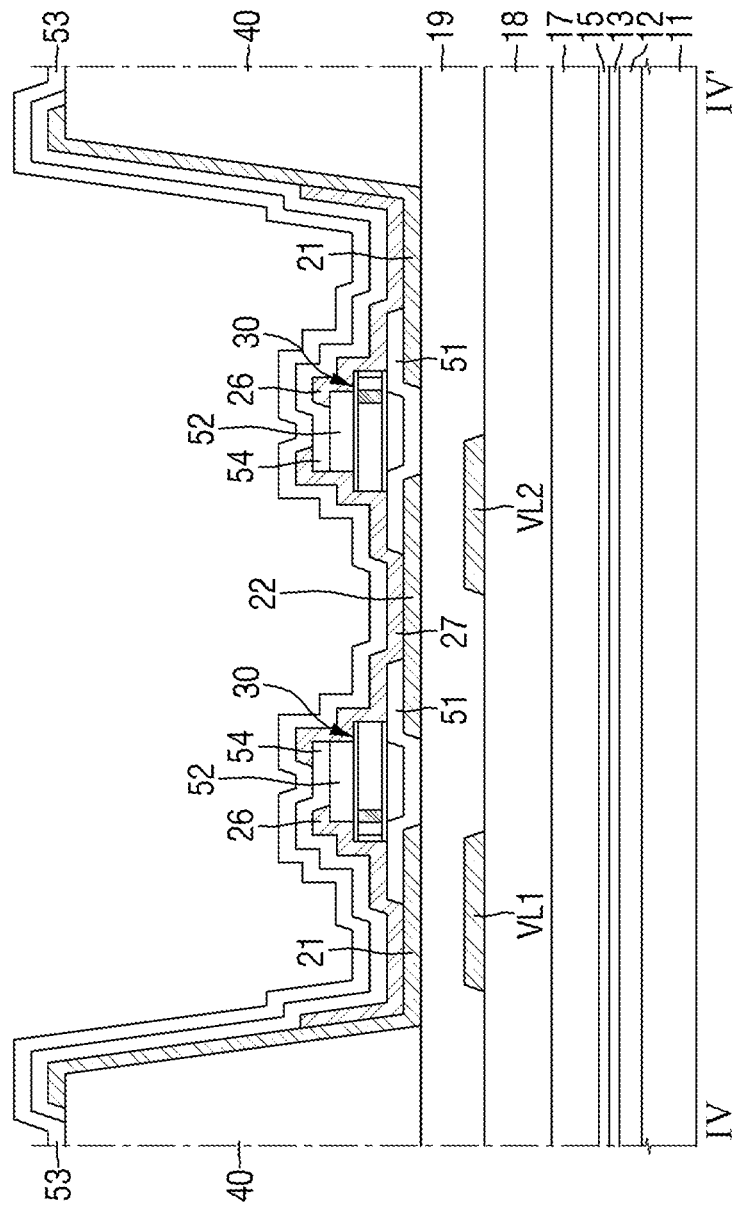
FIG. 6 is a cross-sectional view illustrating a portion of a display device according to another embodiment.

FIG. 6 is a cross-sectional view illustrating a portion of a display device according to another embodiment. The embodiment shown in FIG. 6 is substantially similar to the embodiment shown in FIG. 3 except that the fourth insulating layer 54 is further included. Hereinafter, a redundant description of aspects and features between the two embodiments may be omitted.

Referring to FIG. 6, the display device 10 according to an exemplary embodiment may further include a fourth insulating layer 54. The fourth insulating layer 54 may be disposed to cover the first contact electrode 26, and the second contact electrode 27 may be disposed directly on the fourth insulating layer 54. The fourth insulating layer 54 may be disposed to cover the first contact electrode 26 but may not be disposed on the other end portion of the light emitting element 30 such that the light emitting element 30 contacts the second contact electrode 27. The fourth insulating layer 54 may partially contact the first contact electrode 26 and the second insulating layer 52 on the top surface of the second insulating layer 52. The side surface of the fourth insulating layer 54 in a direction in which the second electrode 22 is disposed may be aligned with one side surface of the second insulating layer 52. The fourth insulating layer 54 shown in FIG. 6 may electrically insulate the first contact electrode 26 and the second contact electrode 27 from each other.

The display device 10 according to an exemplary embodiment may include the first bank 40 and a plurality of electrodes (e.g., external electrodes OE) disposed over the first bank 40. In the display device 10, a unit area occupied by each sub-pixel PXn may be reduced and a manufacturing process of the display device 10 may be simplified. Also, a high-resolution display device may be implemented by including a greater number of pixels PX or sub-pixels PXn per unit area.

The light emitting element 30 may be a light emitting diode (LED). For example, the light emitting element 30 may be an inorganic light emitting diode that has a micrometer or nanometer size and includes (or is made of) an inorganic material. The inorganic light emitting diode may be aligned between two electrodes having polarity when an electric field is formed in a certain direction between the two electrodes facing each other.

Figure 7:
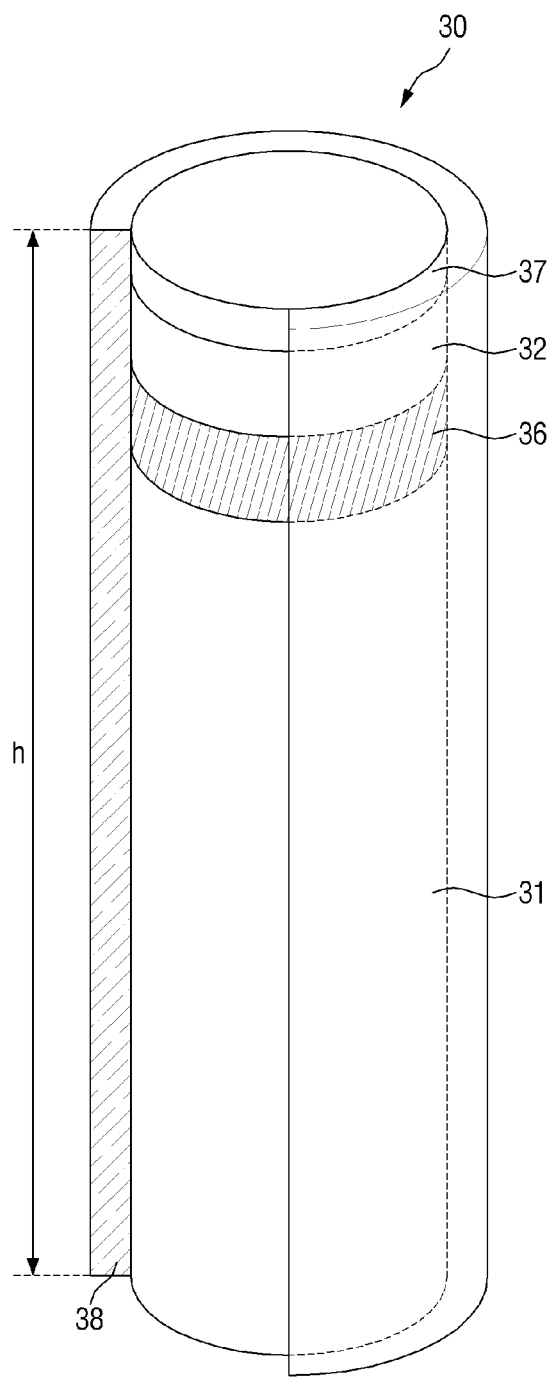
FIG. 7 is a schematic diagram of a light emitting element according to an exemplary embodiment.

FIG. 7 is a schematic diagram of a light emitting element according to an exemplary embodiment.

Referring to FIG. 7, the light emitting element 30 according to an exemplary embodiment may have a shape extending in one direction. The light emitting element may have a shape of a rod, wire, tube, or the like. In an exemplary embodiment, the light emitting element 30 may have a cylindrical or rod shape. However, the shape of the light emitting element 30 is not limited thereto, and the light emitting element 30 may have a polygonal prism shape, such as a regular cube, a rectangular parallelepiped, and a hexagonal prism, or may have various other suitable shapes, such as a shape extending in one direction and having a partially inclined outer surface.

The light emitting element 30 may include a semiconductor layer doped with any conductivity type (e.g., p-type or n-type) impurities. The semiconductor layer may emit light of a specific wavelength band by receiving an electrical signal applied from an external power source. A plurality of semiconductors (e.g., a plurality of semiconductor layers) included in the light emitting element 30 may have a structure in which they are sequentially arranged or stacked along the one direction.

The light emitting element 30 may include a first semiconductor layer 31, a second semiconductor layer 32, an active layer 36, an electrode layer 37, and an insulating layer 38. The light emitting element 30 shown in FIG. 7 has a plurality of semiconductor layers 31, 32, and 36 exposed by partially removing (e.g., partially omitting from the drawing) the insulating layer 38 to visually show each of the components of the light emitting element 30. However, as will be described later, the insulating layer 38 may be disposed to surround the outer surfaces of (e.g., to extend around the periphery of) the plurality of semiconductor layers 31, 32, and 36.

In one embodiment, the first semiconductor layer 31 may be an n-type semiconductor. For example, when the light emitting element 30 is configured to emit light of a blue wavelength band, the first semiconductor layer 31 may include a semiconductor material having a chemical formula of $Al_xGa_yIn_{1-x-y}N(0 \leq x \leq 1, 0 \leq y \leq 1, 0 \leq y \leq 1)$. For example, it may be any one or more of n-type doped AlGaInN, GaN, AlGaN, InGaN, AlN, and InN. That is, the first semiconductor layer 31 may be doped with an n-type dopant. For example, the n-type dopant may be Si, Ge, Sn, or the like. In an exemplary embodiment, the first semiconductor layer 31 may be n-GaN doped with n-type Si. The length of the first semiconductor layer 31 may be in a range of about 1.5 µm to about 5 µm but is not limited thereto.

The second semiconductor layer 32 is disposed on the active layer 36, which is described in more detail below. The second semiconductor layer 32 may be a p-type semiconductor. For example, when the light emitting element 30 is configured to emit light of a blue or green wavelength band, the second semiconductor layer 32 may include a semiconductor material having a chemical formula of $Al_xGa_yIn_{1-x-y}N(0 \leq x \leq 1, 0 \leq y \leq 1, 0 \leq y \leq 1)$. For example, it may be any one or more of p-type doped AlGaInN, GaN, AlGaN, InGaN, AlN, and InN. That is, the second semiconductor layer 32 may be doped with a p-type dopant. For example, the p-type dopant may be Mg, Zn, Ca, Se, Ba, or the like. In an exemplary embodiment, the second semiconductor layer 32 may be p-GaN doped with p-type Mg. The length of the second semiconductor layer 32 may be in a range from about 0.05 µm to about 0.10 µm, but is not limited thereto.

Although an embodiment in which the first semiconductor layer 31 and the second semiconductor layer 32 are configured as one layer is shown, the present disclosure is not limited thereto. According to some embodiments, depending on the material of the active layer 36, the first semiconductor layer 31 and the second semiconductor layer 32 may include a greater number of layers (e.g., may further include other layers), such as a cladding layer or a tensile strain barrier reducing (TSBR) layer.

The active layer 36 is disposed between the first semiconductor layer 31 and the second semiconductor layer 32. The active layer 36 may include a material having a single or multiple quantum well structure. When the active layer 36 includes a material having a multiple quantum well structure, a plurality of quantum layers and well layers may be alternately stacked. The active layer 36 may emit light by the coupling of electron-hole pairs according to an electrical signal applied through the first semiconductor layer 31 and the second semiconductor layer 32. For example, when the active layer 36 is configured to emit light of a blue wavelength band, a material, such as AlGaN or AlGaInN, may be included. For example, when the active layer 36 has a structure in which quantum layers and well layers are alternately stacked in a multiple quantum well structure, the quantum layer may include a material, such as AlGaN or AlGaInN, and the well layer may include a material, such as GaN or AlInN. In an exemplary embodiment, the active layer 36 may include AlGaInN as a quantum layer and AlInN as a well layer, and the active layer 36 may emit blue light having a central wavelength band in a range of about 450 nm to about 495 nm.

However, the present disclosure is not limited thereto, and the active layer 36 may have a structure in which semiconductor materials having large band gap energy and semiconductor materials having small band gap energy are alternately stacked, and the active layer 36 may include other Group III to V semiconductor materials according to the wavelength band of the emitted light. The active layer 36 is not limited to emitting light of a blue wavelength band, and it may be configured to emit light of a red or green wavelength band in some embodiments. The length of the active layer 36 may be in a range of about 0.05 µm to about 0.10 µm but is not limited thereto.

The active layer 36 may emit light at both side surfaces as well as the outer surface of the light emitting element 30 in a longitudinal direction. The directionality of light emitted from the active layer 36 is not limited to one direction.

The electrode layer 37 may be an ohmic contact electrode. However, the present disclosure is not limited thereto, and the electrode layer 37 may be a Schottky contact electrode. The light emitting element 30 may include at least one electrode layer 37. Although the light emitting element 30 shown in FIG. 7 includes one electrode layer 37, the present disclosure is not limited thereto. In some embodiments, the light emitting element 30 may include a greater number of electrode layers 37 or may be omitted. The following description of the light emitting element 30 may be equally applied even when the number of electrode layers 37 is different or further includes other structures.

In the display device 10 according to an exemplary embodiment, when the light emitting element 30 is electrically connected to an electrode or a contact electrode, the electrode layer 37 may reduce the resistance between the light emitting element 30 and the electrode or contact electrode. The electrode layer 37 may include a conductive metal. For example, the electrode layer 37 may include at least one of aluminum (Al), titanium (Ti), indium (In), gold (Au), silver (Ag), indium tin oxide (ITO), indium zinc oxide (IZO), and indium tin zinc oxide (ITZO). Further, the electrode layer 37 may include an n-type or p-type doped semiconductor material. The length of the electrode layer 37 may be in a range of about 0.05 µm to about 0.10 µm, but is not limited thereto.

The insulating layer 38 is disposed to surround the outer surfaces of the plurality of semiconductor layers and electrode layers of the light emitting element 30 as described above. In an exemplary embodiment, the insulating layer 38 is disposed to surround at least the outer surface of the active layer 36, and the light emitting element 30 may extend in one extending direction. The insulating layer 38 may function to protect the members (e.g., the underlying layers). For example, the insulating layer 38 may be formed to surround side surfaces of the members while exposing both ends of the light emitting element 30 in the longitudinal direction.

Although the insulating layer 38 is shown as extending in the longitudinal direction of the light emitting element 30 to cover a region from the first semiconductor layer 31 to the side surface of the electrode layer 37, the present disclosure is not limited thereto. The insulating layer 38 may cover only the outer surfaces of some of the semiconductor layers or may cover only a portion of the outer surface of the electrode layer 37 to partially expose the outer surface of the electrode layer 37. Further, in cross-sectional view, the insulating layer 38 may have a top surface, which is rounded in a region adjacent to at least one end portion of the light emitting element 30.

The thickness of the insulating layer 38 may be in a range of about 10 nm to about 1.0 μm but is not limited thereto. In one embodiment, the thickness of the insulating layer 38 may be about 40 nm.

The insulating layer 38 may include materials having insulating properties, for example, silicon oxide ($SiO_x$), silicon nitride ($SiN_x$), silicon oxynitride ($SiO_xN_y$), aluminum nitride (AlN), aluminum oxide ($A_2O_3$), and the like. Accordingly, an electrical short circuit that may occur when the active layer 36 directly contacts the electrode through which the electrical signal is transmitted to the light emitting element 30 may be prevented. In addition, because the insulating layer 38 protects the outer surface of the light emitting element 30 including the active layer 36, a decrease in luminous efficiency may be prevented.

Further, in some embodiments, the insulating layer 38 may have an outer surface which is surface-treated. When the display device 10 is manufactured, the light emitting elements 30 may be aligned by being sprayed on the electrodes while being dispersed in an ink (e.g., a predetermined ink). Here, the surface of the insulating layer 38 may be treated in a hydrophobic or hydrophilic manner to keep the light emitting elements 30 in a dispersed state without aggregating with other, adjacent light emitting elements 30 in the ink.

The light emitting element 30 may have a length (e.g., a height) h in a range of about 1 μm to about 10 μm, for example in a range of about 2 μm to about 6 μm, and in some embodiments, in a range of about 3 μm to about 5 μm. Further, a diameter of the light emitting element 30 may be in a range of about 30 nm to about 700 nm, and an aspect ratio of the light emitting element 30 may be in a range of about 1.2 to about 100. However, the present disclosure is not limited thereto, and the plurality of light emitting elements 30 included in the display device 10 may have different diameters according to a difference in composition of the active layer 36. In some embodiments, the diameter of the light emitting element 30 may be about 500 nm.

Hereinafter, a manufacturing process of the display device 10 according to an embodiment of the present disclosure will be described with reference to FIGS. 8 to 13.

FIGS. 8 to 13 are cross-sectional views illustrating a process of manufacturing a display device according to an exemplary embodiment.

Figure 8:
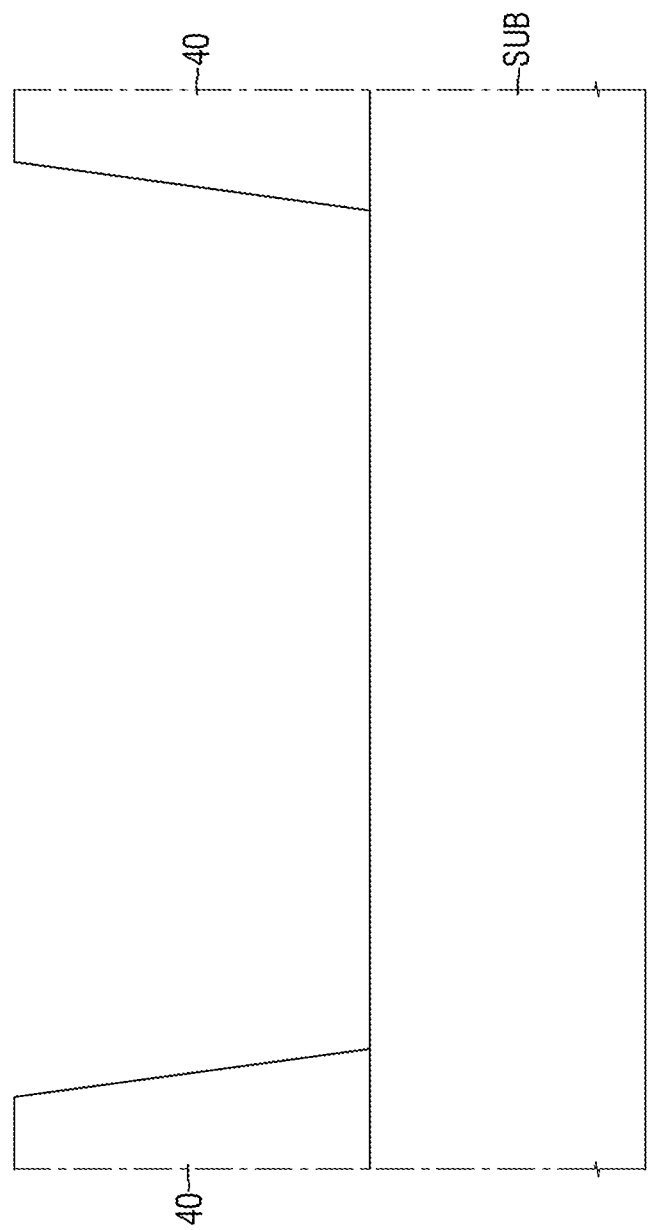
FIGS. 8 to 13 are cross-sectional views illustrating a process of manufacturing a display device according to an exemplary embodiment.

First, referring to FIG. 8, a target substrate SUB is prepared, and the first bank 40 is formed on the target substrate SUB. A plurality of pixels PX and sub-pixels PXn may be defined on the target substrate SUB, and the first bank 40 is disposed at the boundary of the sub-pixels PXn to surround (e.g., to extend around a periphery of) the emission regions EMA. FIG. 8 shows a cross section of the second extension portion 42 of the first bank 40 extending in the second direction DR2. A description thereof is the same or substantially similar as described above. The target substrate SUB may include (or may be) the first substrate 11 described above and may include a plurality of circuit elements including a plurality of conductive layers and a plurality of insulating layers. Hereinafter, for simplicity of description, the target substrate SUB will be described as including them without a repeated description thereof.

Figure 9:
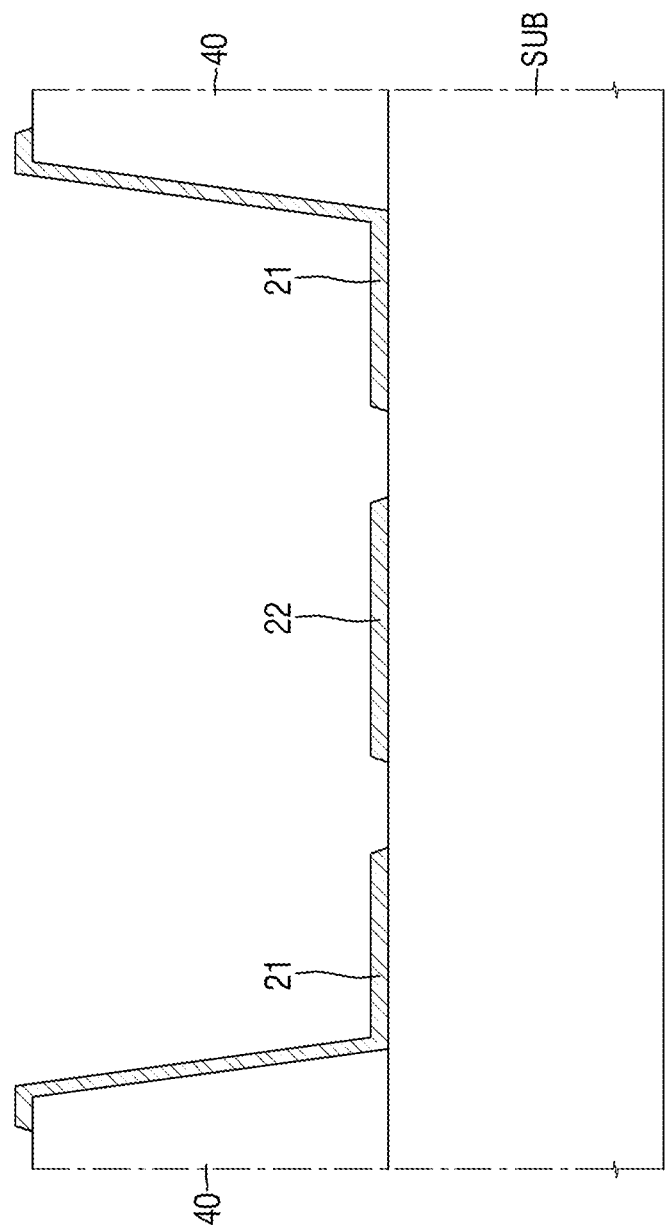

Subsequently, referring to FIG. 9, a plurality of electrodes 21 and 22 are formed on the target substrate SUB and the first bank 40. The plurality of electrodes 21 and 22 may include first electrodes 21 disposed to at least partially overlap the first bank 40 and second electrodes 22 disposed between the first electrodes 21 so as not to overlap the first bank 40. In an exemplary embodiment, the first electrodes 21 may be external electrodes OE, and the second electrodes 22 may be internal electrodes IE. The arrangement and shape of the electrodes 21 and 22 are the same or substantially similar as described above with reference to FIGS. 2 to 4.

Figure 10:
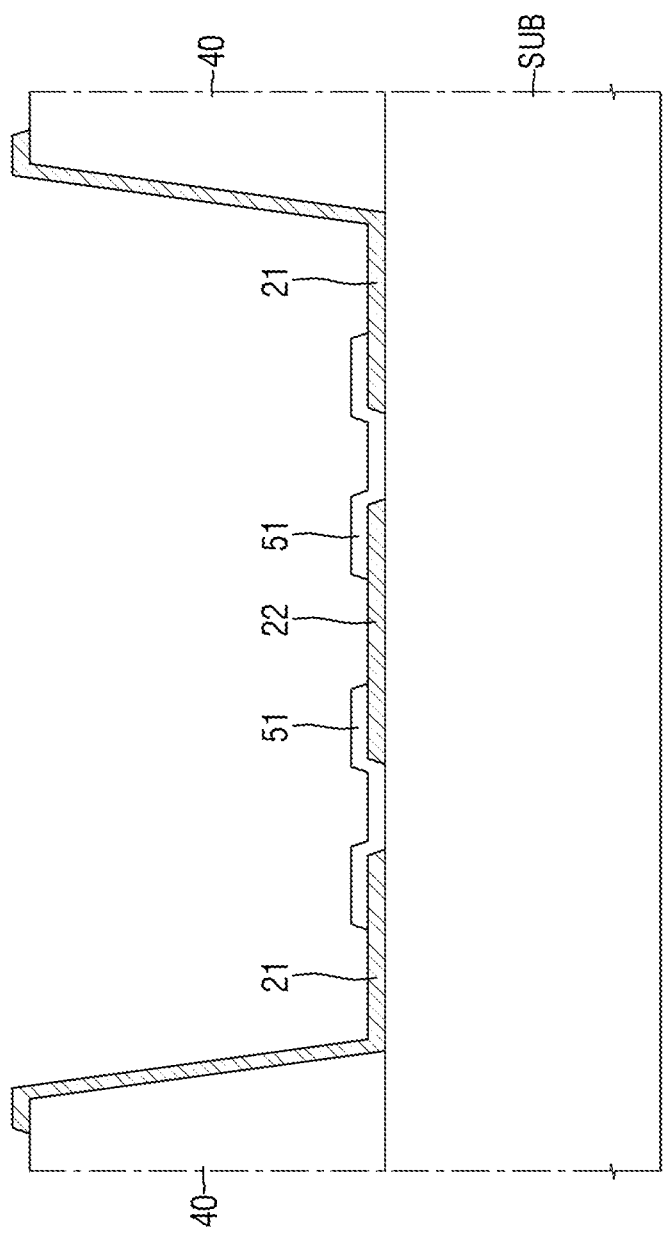
Figure 11:
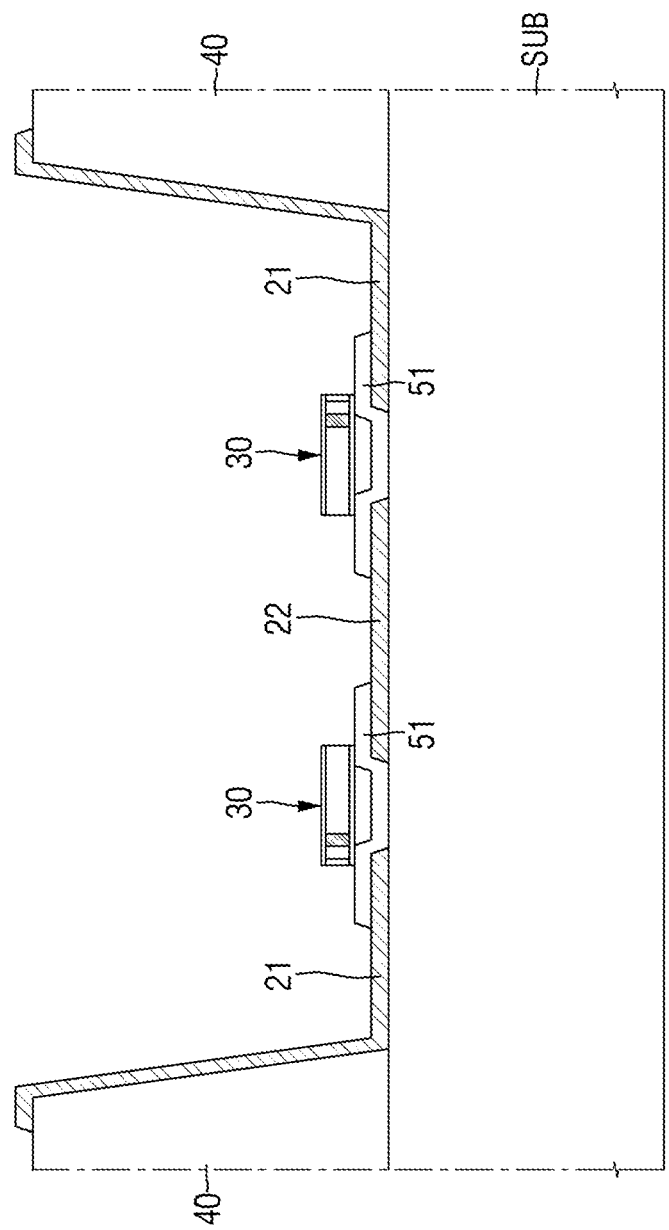

Next, referring to FIGS. 10 and 11, a first insulating layer 51 is formed between the electrodes 21 and 22, and light emitting elements 30 are disposed on the first insulating layer 51 between the first electrode 21 and the second electrode 22. The first insulating layer 51 may partially cover the first electrode 21 and the second electrode 22. In some embodiments, the first insulating layer 51 may be disposed entirely on the target substrate SUB while exposing a portion of the top surface of each of the electrodes 21 and 22.

At least one end portion of the light emitting element 30 may be placed on the electrodes 21 and 22 and may be disposed between them. In an exemplary embodiment, the light emitting elements 30 are prepared by being dispersed in ink and may be sprayed onto the target substrate SUB by a printing process using, for example, an inkjet printing device. The light emitting elements 30 dispersed in the ink and sprayed on the electrodes 21 and 22 may be stably placed between the electrodes 21 and 22 by an alignment signal applied to each of electrodes 21 and 22. For example, when an alignment signal is applied to the first electrode 21 and the second electrode 22, an electric field may be generated between the electrodes 21 and 22 and in the ink sprayed on the electrodes 21 and 22. When an electric field is generated between the first electrode 21 and the second electrode 22, the light emitting elements dispersed in the ink may be subjected to a dielectrophoretic force by the electric field. The light emitting elements 30 subjected to the dielectrophoretic force may be stably placed between (e.g., aligned between) the first electrode 21 and the second electrode 22 by changing their orientation direction and position.

Figure 12:
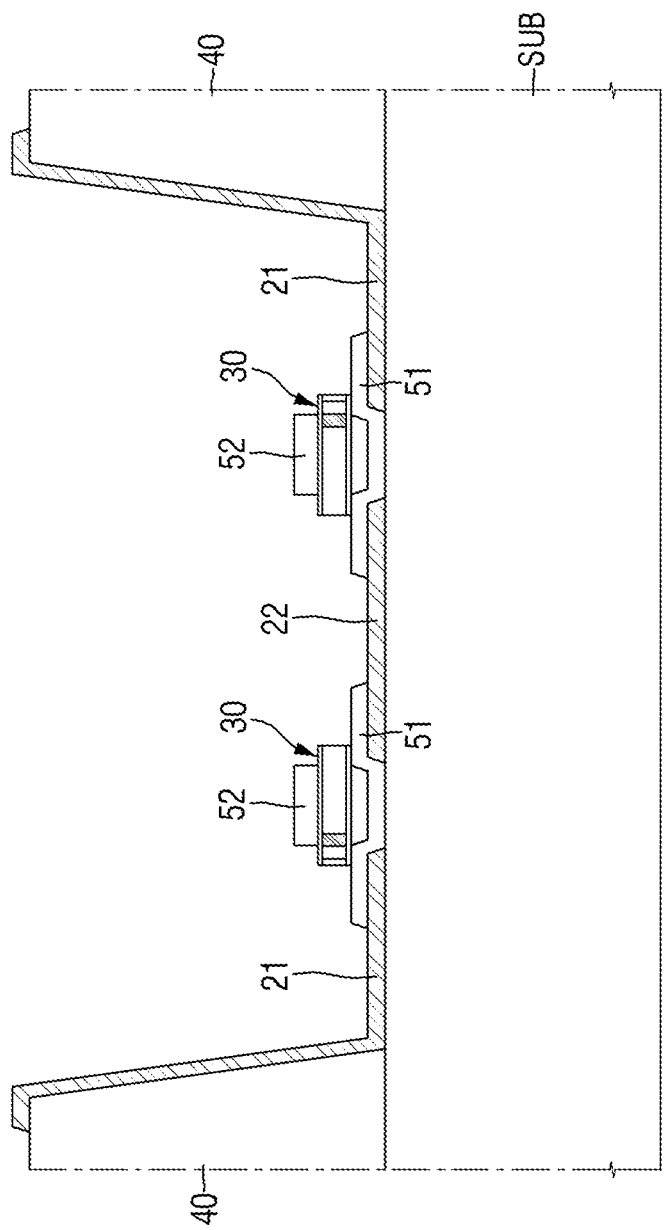

Next, referring to FIG. 12, a second insulating layer 52 disposed on the light emitting element 30 is formed between the first electrode 21 and the second electrode 22. The second insulating layer 52 may be disposed between the first electrode 21 and the second electrode 22 in a direction in which they extend. The second insulating layer 52 may be formed to surround the outer surface of (e.g., the outer peripheral surface of) the light emitting element 30 and to expose both ends thereof. The second insulating layer 52 may function to fix the light emitting elements 30 during the manufacturing process of the display device 10. The position of the light emitting element 30 aligned between the electrodes 21 and 22 is fixed by the second insulating layer 52, thereby preventing the light emitting element 30 from moving (or substantially moving) in a subsequent process.

Figure 13:
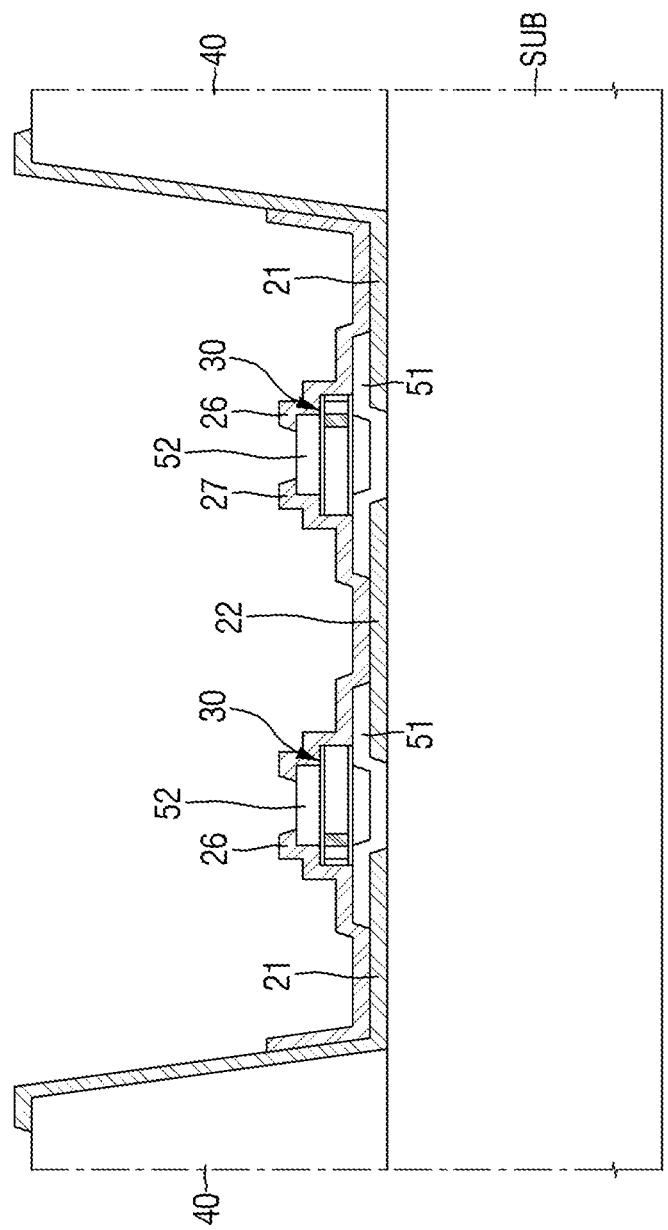

Next, referring to FIG. 13, a plurality of contact electrodes 26 and 27 disposed on the plurality of electrodes 21 and 22 are formed. The contact electrodes 26 and 27 may include a first contact electrode 26 contacting one end portion of the light emitting element 30 and the first electrode 21 and a second contact electrode 27 contacting the other end portion of the light emitting element 30 and the second electrode 22.

Both ends of the light emitting element 30 may be electrically connected to the first electrode 21 and the second electrode 22 through the first contact electrode 26 and the second contact electrode 27, respectively.

Next, the display device 10 may be manufactured by forming a third insulating layer 53 covering the members disposed on the target substrate SUB.

In the manufacturing process of the display device 10, the area occupied by each pixel PX and sub-pixel PXn may be reduced by arranging some of the plurality of electrodes 21 and 22 on the first bank 40 to cover the first bank 40. The display device 10 may include a greater number of pixels PX per unit area, thereby implementing a high-resolution display device.

Hereinafter, various embodiments of the display device 10 will be described with reference to other drawings.

Figure 14:
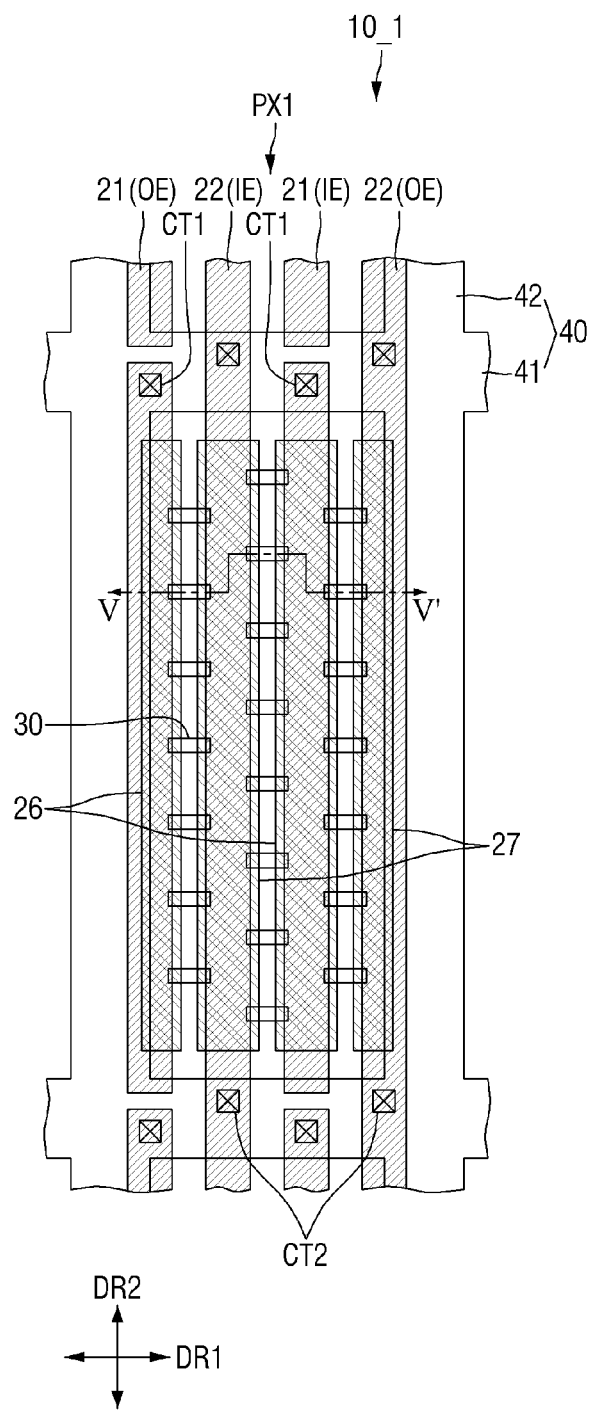
FIG. 14 is a plan view illustrating a sub-pixel of a display device according to another embodiment.
Figure 15:
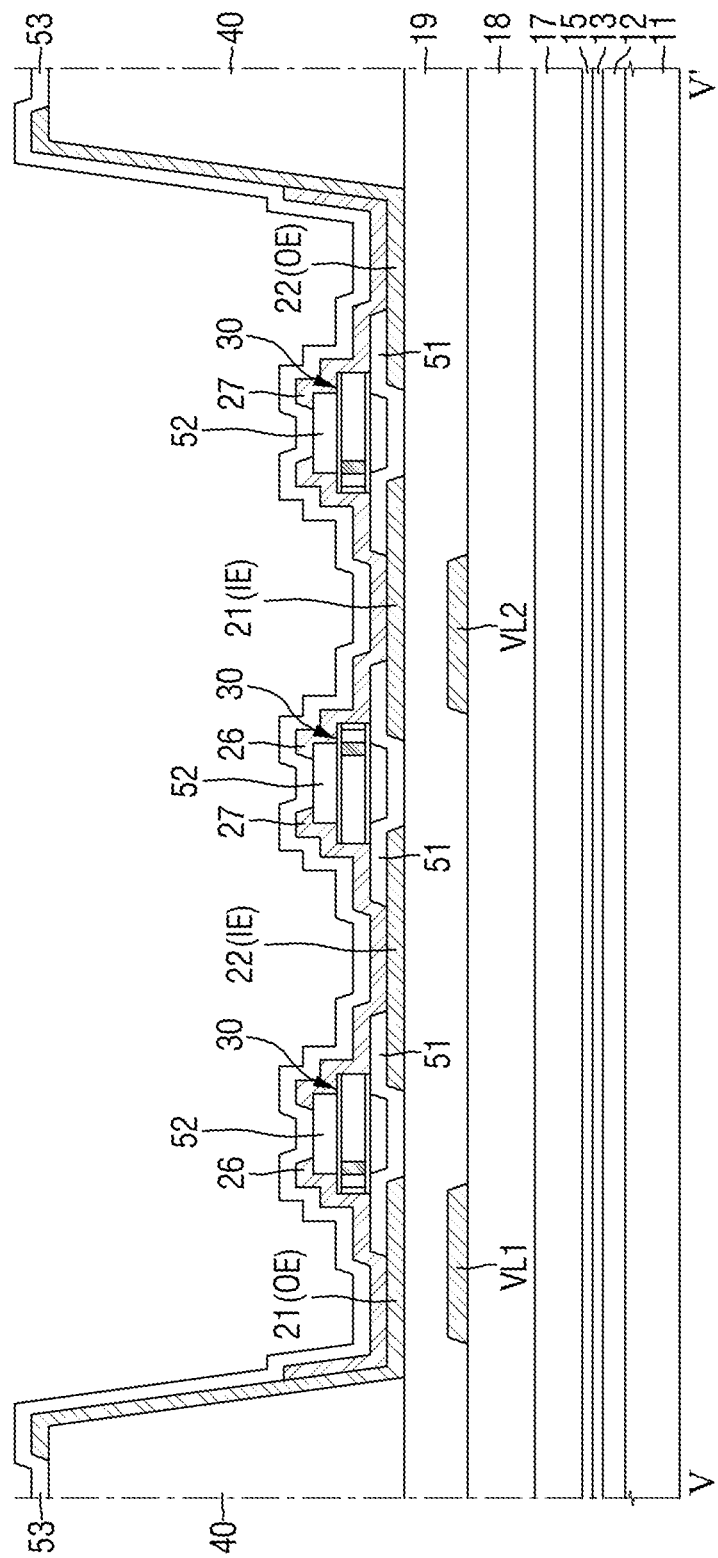
FIG. 15 is a cross-sectional view taken along the line V-V' of FIG. 14.

FIG. 14 is a plan view illustrating a sub-pixel of a display device according to another embodiment, and FIG. 15 is a cross-sectional view taken along the line V-V of FIG. 14. The embodiment shown in FIGS. 14 and 15 differs from the embodiment shown in FIGS. 2 to 4 in that it includes a greater number of electrodes. In the following description, a redundant description of aspects and features that are the same or substantially similar between these embodiments may be omitted while differences therebetween will be primarily described.

Referring to FIGS. 14 and 15, a display device 10_1 according to the present embodiment may include a greater number of electrodes 21 and 22. The display device 10_1 may include two internal electrodes IE and two external electrodes OE in each sub-pixel PXn. The inner electrodes IE and the outer electrodes OE may each include first electrodes 21 and second electrodes 22, and they may be spaced apart from each other and alternately placed (e.g., alternately arranged).

The number of the electrodes 21 and 22 may vary according to the area (e.g., the size) of each sub-pixel PXn or the number of light emitting elements 30 in each sub-pixel PXn. The display device 10_1 shown in FIGS. 14 and 15 may include a greater number of light emitting elements 30 by including two first electrodes 21 and two second electrodes 22. One first electrode 21 and one second electrode 22 are disposed to overlap the second extension portion 42 of the first bank 40 in the second direction DR2. The other first electrode 21 and the other second electrode 22 are spaced apart from the second extension portion 42 so as not to overlap the second extension portion 42 and are disposed in the second direction DR2.

Different from the embodiment shown in FIG. 4, the external electrodes OE disposed to overlap the second extension portion 42 of the first bank 40 may include one first electrode 21 and one second electrode 22. Also, the internal electrodes IE may include one first electrode 21 and one second electrode 22. For example, the external electrodes OE of the display device 10 may include the first electrode 21 or the second electrode 22 according to the number of electrodes 21 and 22 disposed in each sub-pixel PXn. The display device 10_1 according to the present embodiment may include a greater number of light emitting elements 30 per unit sub-pixel PXn by including a greater number of electrodes 21 and 22.

Figure 16:
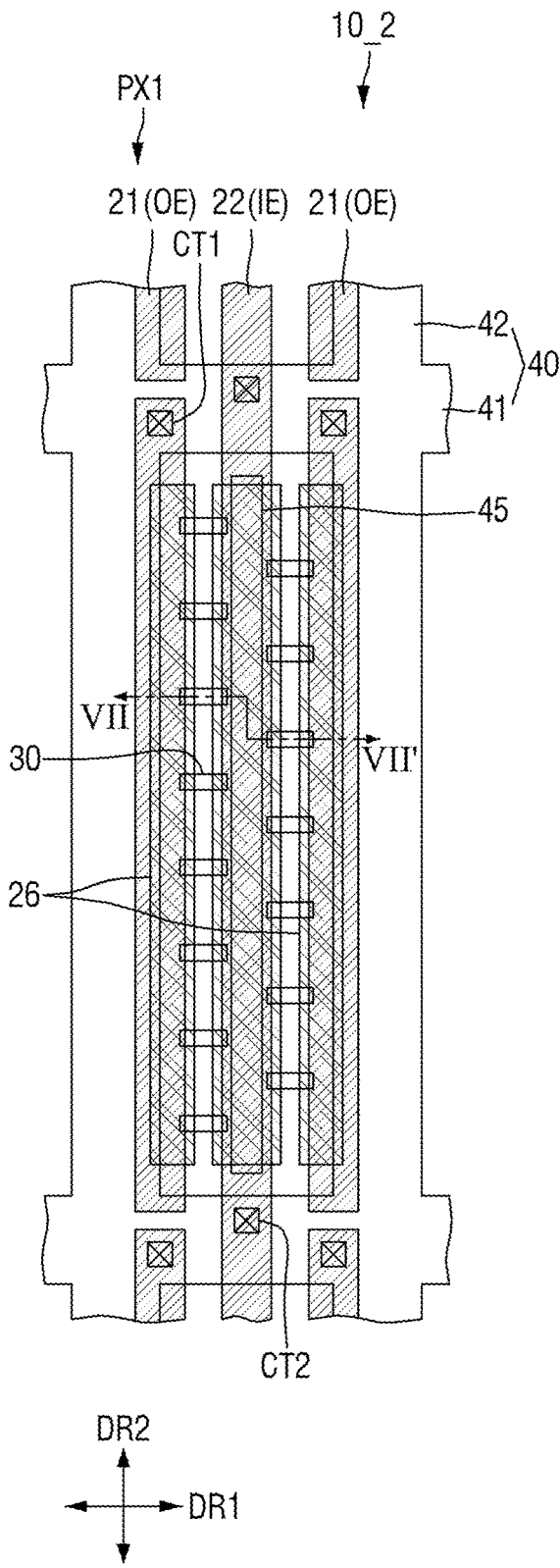
FIG. 16 is a plan view illustrating a sub-pixel of a display device according to still another embodiment.
Figure 17:
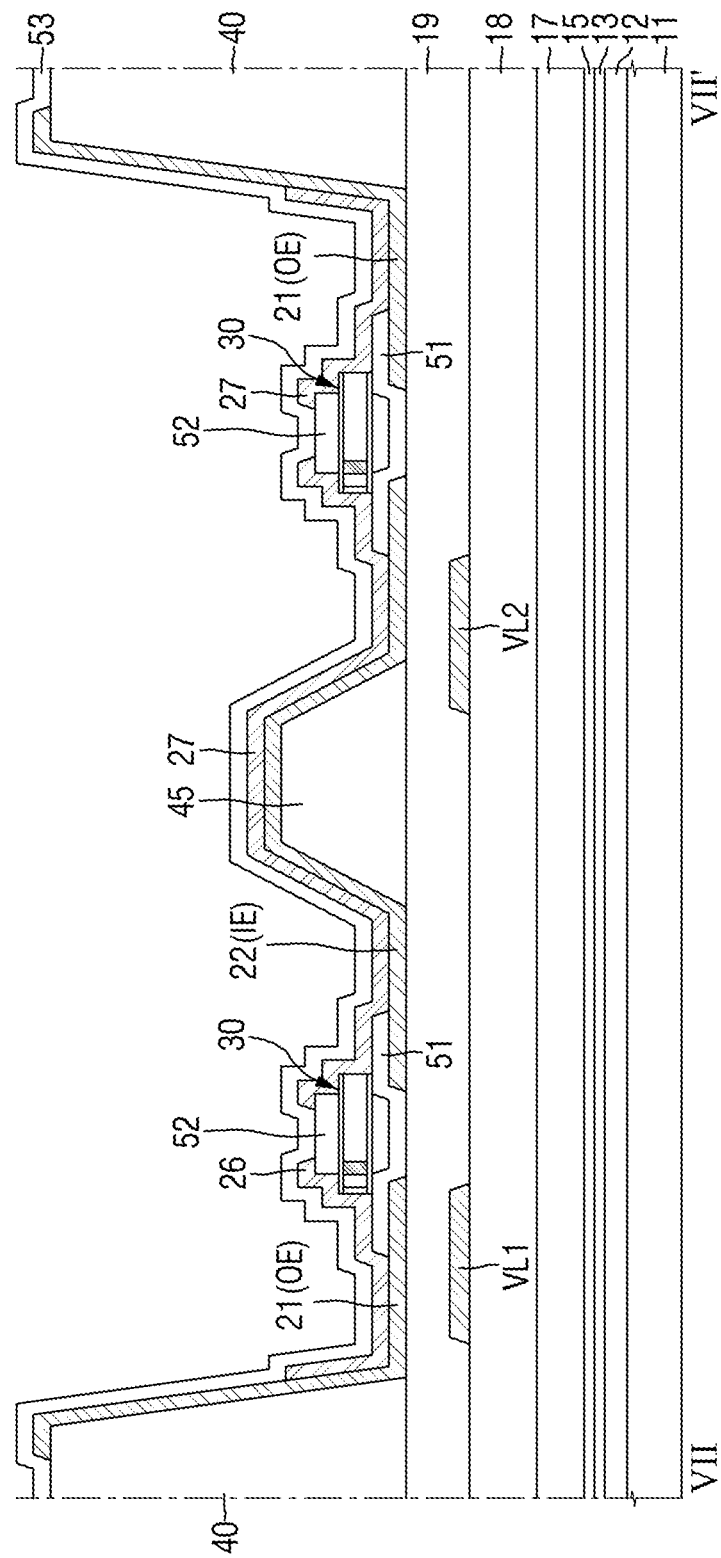
FIG. 17 is a cross-sectional view taken along the line VII-VII' of FIG. 16.
Figure 18:
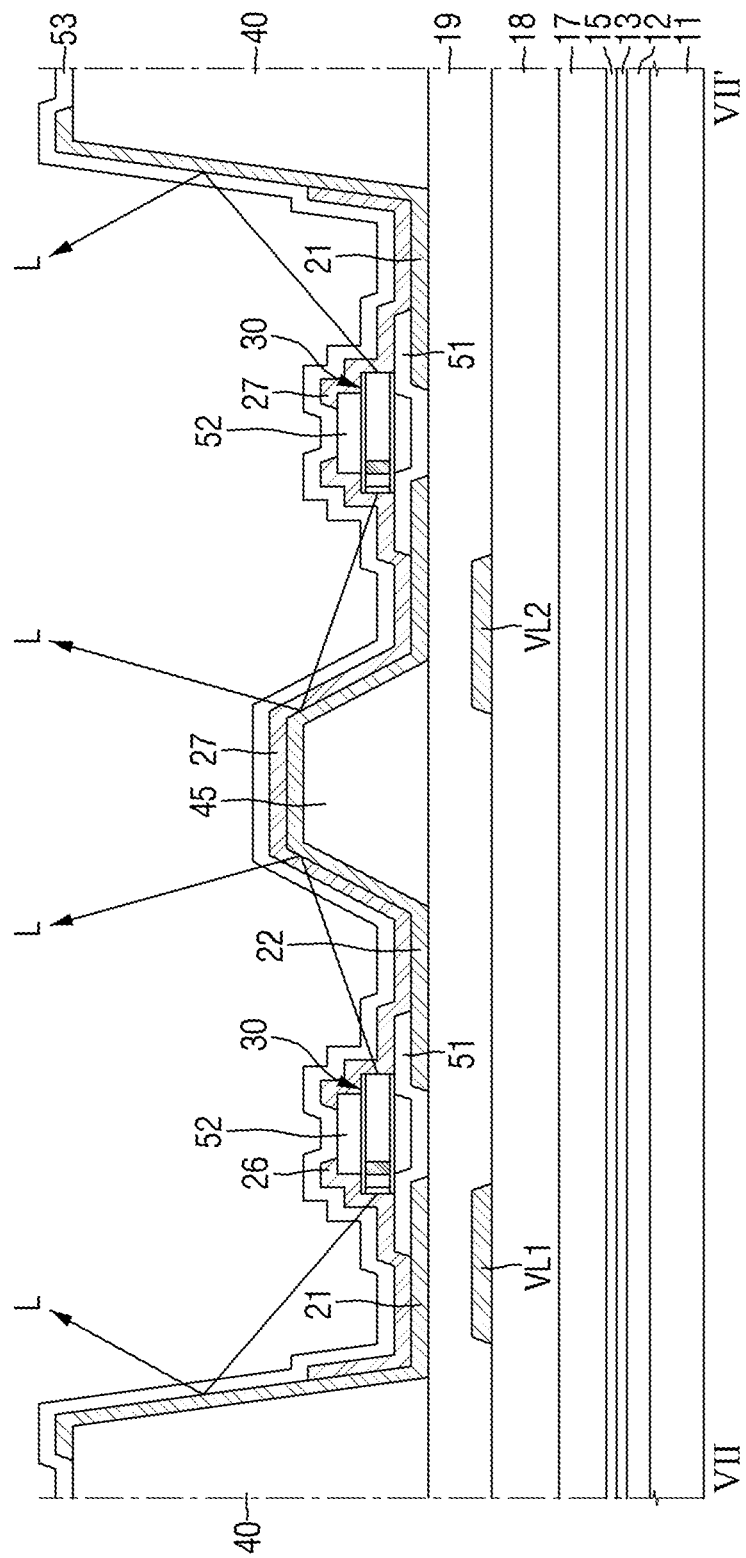
FIG. 18 is a schematic diagram illustrating paths of light emitted from a light emitting element of the display device shown in FIG. 17.

FIG. 16 is a plan view illustrating a sub-pixel of a display device according to another embodiment, FIG. 17 is a cross-sectional view taken along the line VII-VII' of FIG. 16, and FIG. 18 is a schematic diagram illustrating how light emitted from a light emitting element of the display device shown in FIG. 17 proceeds. The display device 10_2 according to the present embodiment is different from the embodiments of FIGS. 2 to 4 in that it further includes a second bank 45. In In the following description, a redundant description of aspects and features that are the same or substantially similar between these embodiments may be omitted while differences therebetween will be primarily described.

Referring to FIGS. 16 to 18, a display device 10_2 according to the present embodiment may further include at least one second bank 45 disposed in each sub-pixel PXn, and the second bank 45 may be disposed between at least one of the electrodes 21 and 22 and the first planarization layer 19. From among the plurality of electrodes 21 and 22, the internal electrodes IE (e.g., the second electrode 22) may be disposed on the second bank 45.

The second bank 45 may be disposed directly on the first planarization layer 19. The second bank 45 may extend in the second direction DR2 within each sub-pixel PXn but may terminate to be separated from (e.g., spaced from) the boundary between the sub-pixels PXn so as not to extend to other (e.g., adjacent) sub-pixels PXn adjacent thereto in the second direction DR2. Further, the second bank 45 may be disposed to be separated from and face the second extension portion 42 of the first bank 40 in the first direction DR1. A region in which the light emitting element 30 is disposed may be formed between the second extension portion 42 of the first bank 40 and the second bank 45. The second bank 45 may be disposed in each sub-pixel PXn to form a linear pattern in the display area DPA of the display device 10. One second bank 45 may be disposed in each sub-pixel PXn, but the present disclosure is not limited thereto. The number of second banks 45 may vary according to the number of internal electrodes IE disposed in each sub-pixel PXn.

The second bank 45 may have a structure in which at least a portion thereof protrudes from the top surface of the first planarization layer 19. The protruding portion of the second bank 45 may have an inclined side surface, and light emitted from the light emitting element 30 may proceed toward the inclined side surface of the second bank 45. The internal electrodes IE disposed on the second bank 45 may include a material having high reflectivity, and the light emitted from the light emitting element 30 may be reflected by the electrodes 21 and/or 22 disposed on the side surface of the second bank 45 to be emitted in the upward direction of the first planarization layer 19. For example, the second bank 45 may provide a region in which the light emitting element 30 is disposed and may also function as a reflective partition wall that reflects light emitted from the light emitting element 30 upward. The side surface of the second bank 45 may be inclined in a linear shape but is not limited thereto, and in other embodiments, the outer surface of the second bank 45 may have a curved semicircle or semi-ellipse shape. In an exemplary embodiment, the second banks 45 may include an organic insulating material, such as polyimide (PI), but are not limited thereto.

According to an exemplary embodiment, the height of the second bank 45 may be lower than the height of the first bank 40. The second bank 45 may have a height lower than the first bank 40. The height of the second bank 45 is not particularly limited as long as it is greater than the height measured from the first planarization layer 19 to the light emitting element 30 (e.g., as long as the second bank protrudes above the light emitting element 30).

As illustrated in FIG. 18, the light emitted from the light emitting element 30 disposed between the external electrode OE (e.g., the first electrodes 21) and the internal electrode IE (e.g., the second electrode 22) may proceed toward the side surfaces of the first bank 40 and the second bank 45. The light may be reflected by the electrodes 21 and 22 disposed on the side surfaces of the first bank 40 and the second bank 45 and proceed in the upward direction of the first planarization layer 19. Thus, the display device 10_2 according to the present embodiment further includes the second banks 45 which act as a reflective partition wall, thereby improving light emission efficiency of the light emitted from the light emitting element 30.

Each of the plurality of first electrodes 21 may contact the first conductive pattern CDP through the first contact opening CT1, thereby being electrically connected to the driving transistor DT. The light emitting elements 30 disposed between one first electrode 21 and one second electrode 22 may establish parallel connections with the light emitting elements 30 disposed between the other first electrode 21 and the other second electrode 22 (e.g., the light emitting elements 30 may be connected to each other in parallel). However, the present disclosure is not limited thereto, and in some embodiments, the display device 10 may further include an electrode that is not directly connected to circuit elements disposed below the first planarization layer 19, and the light emitting elements 30 disposed between them may establish a series connection (e.g., the light emitting elements 30 may be connected to each other in series).

Figure 19:
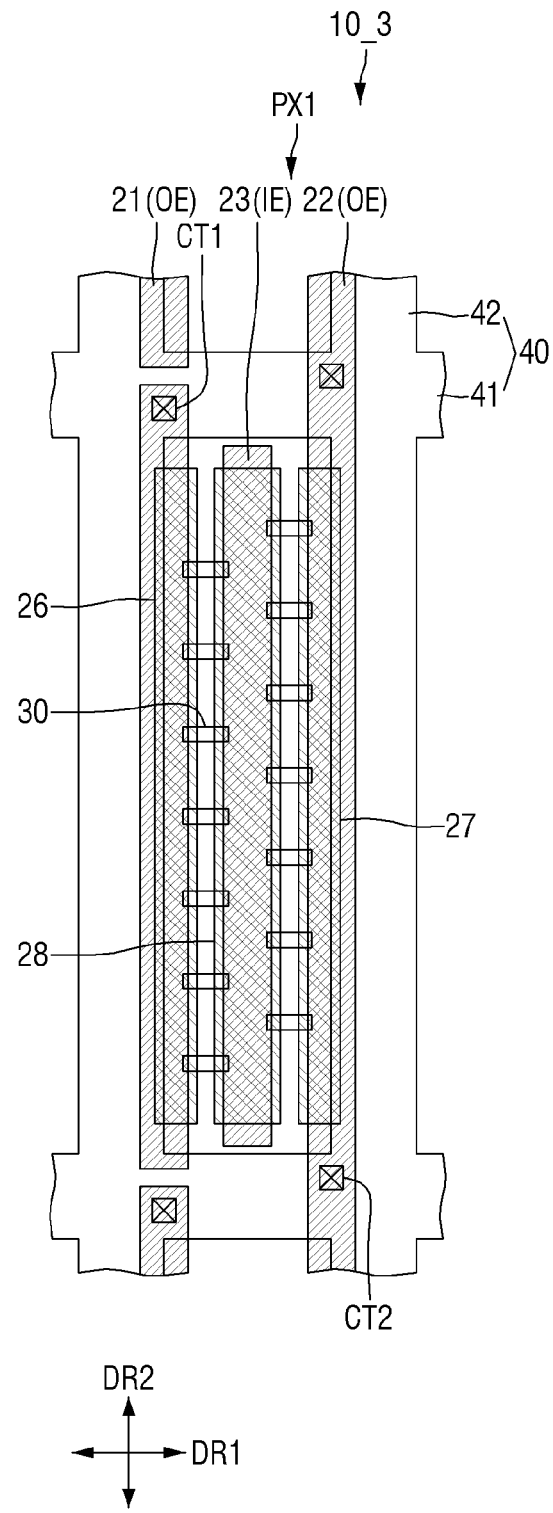
FIG. 19 is a plan view illustrating a sub-pixel of a display device according to still another embodiment.

FIG. 19 is a plan view illustrating a sub-pixel of a display device according to another embodiment. The present embodiment is different from the embodiment shown in FIGS. 2 to 4 in that each sub-pixel PXn of the display device 10_3 further includes the third electrode 23 and the third contact electrode 28. In the following description, a description of the same or substantially similar aspects and features therebetween may be omitted and the third electrode 23 will be primarily described in detail.

Referring to FIG. 19, a display device 10_3 according to the present embodiment may further include a third electrode 23 disposed between the first electrode 21 and the second electrode 22 in each sub-pixel PXn. The contact electrodes 26, 27, and 28 may further include a third contact electrode 28 disposed on the third electrode 23. In the display device 10_3, the external electrode OE may include one first electrode 21 and one second electrode 22, and the internal electrode IE may include one third electrode 23. However, the present disclosure is not limited thereto, and the internal electrode IE may include a greater number of third electrodes 23. The plurality of light emitting elements 30 may be disposed between the first electrode 21 and the third electrode 23 and between the third electrode 23 and the second electrode 22.

The third electrode 23 is disposed between the first electrode 21 and the second electrode 22. The third electrode 23 may be disposed directly on the first planarization layer 19. However, the present disclosure is not limited thereto, and the second bank 45 may be further disposed between the third electrode 23 and the first planarization layer 19 (e.g., the third electrode 23 may be formed on the second bank 45). The third electrode 23 may have a shape extending in the second direction DR2. However, different from the first electrode 21 and the second electrode 22, the third electrode 23 may extend in the second direction DR2 and may be disposed to be spaced from the first extension portion 41 of the first bank 40 so as not to overlap the first extension portion 41 of the first bank 40. For example, the length of the third electrode 23 measured in the second direction DR2 may be shorter than that of the first electrode 21 and the second electrode 22 and may be disposed so as not to exceed the boundary with the neighboring sub-pixel PXn.

The plurality of light emitting elements 30 may be disposed between the first electrode 21 and the third electrode 23 and between the third electrode 23 and the second electrode 22. The third contact electrode 28 may have the same or a substantially similar shape as the first contact electrode 26 and the second contact electrode 27 but may be disposed on the third electrode 23. For example, the third contact electrode 28 may include a conductive polymer.

The light emitting elements 30 disposed between the first electrode 21 and the third electrode 23 may have both ends contacting the first contact electrode 26 and the third contact electrode 28, respectively, to be electrically connected to the first electrode 21 and the third electrode 23. The light emitting elements 30 disposed between the third electrode 23 and the second electrode 22 may have both ends contacting the third contact electrode 28 and the second contact electrode 27, respectively, to be electrically connected to the third electrode 23 and the second electrode 22.

Also, different from the first electrode 21 and the second electrode 22, the third electrode 23 may not be directly connected to the circuit element layer through a contact opening (e.g., a contact hole). Electrical signals applied to the first electrode 21 and the second electrode 22 may be transmitted to the third electrode 23 through the first contact electrode 26 and the second contact electrode 27 and the light emitting elements 30. For example, the light emitting elements 30 disposed between the first electrode 21 and the third electrode 23 and the light emitting elements 30 disposed between the third electrode 23 and the second electrode 22 may establish a series connection. The display device 10_3 according to the present embodiment may further include the third electrode 23 such that a plurality of light emitting elements 30 establish a series connection, thereby further improving light emission efficiency of each sub-pixel PXn.

Figure 20:
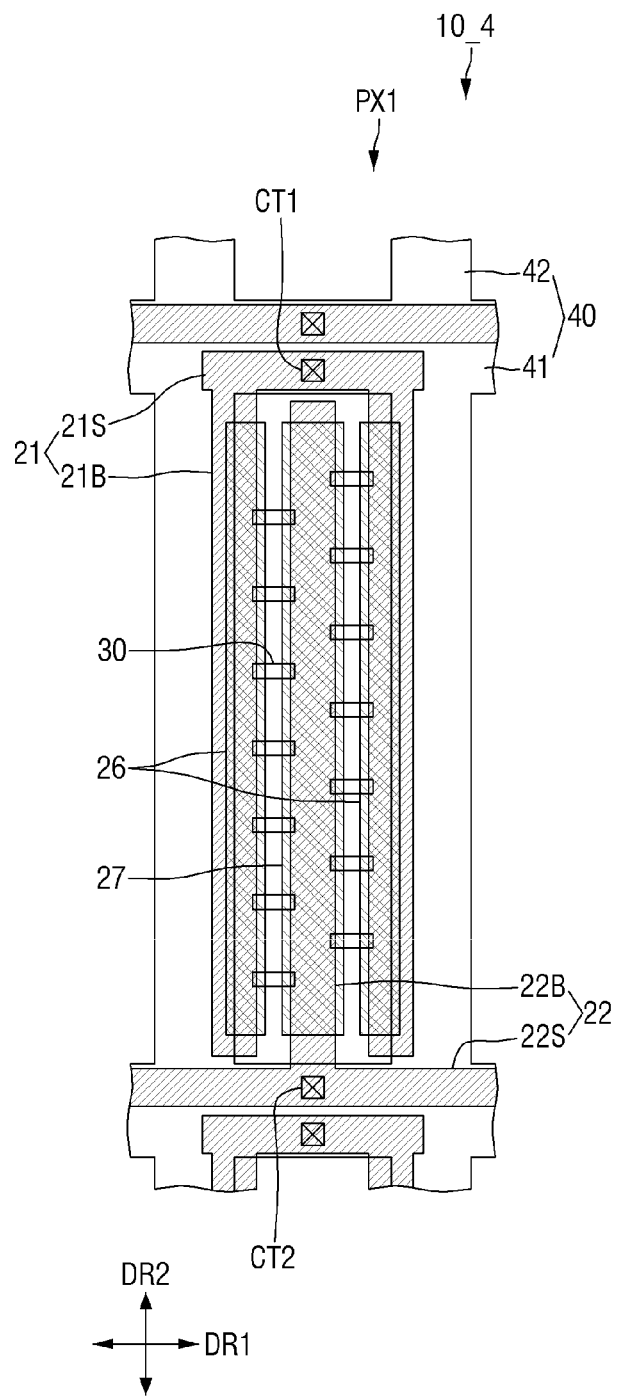
FIG. 20 is a plan view illustrating a sub-pixel of a display device according to still another embodiment.

FIG. 20 is a plan view illustrating a sub-pixel of a display device according to another embodiment. The present embodiment is different from the embodiment shown in FIG. 2 in that the electrodes 21 and 22 have different shapes. In the following description, a description of the same or substantially similar aspects and features therebetween may be omitted, and the structures of the first electrode 21 and the second electrode 22 will be primarily described in detail.

Referring to FIG. 20, a display device 10_4 according to the present embodiment may include electrode stem portions 21S and 22S in which the first electrode 21 and the second electrode 22 extend in the first direction DR1, respectively, and electrode branch portions 21B and 22B branched from the electrode stem portions 21S and 22S in the second direction DR2. In an exemplary embodiment, the first electrode 21 may include a first electrode stem portion 21S having a shape extending in the first direction DR1 within each sub-pixel PXn and a plurality of first electrode branch portions 21B branched from the first electrode stem portion 21S in the second direction DR2. The second electrode 22 may include a second electrode stem portion 22S extending in the first direction DR1 and disposed over the plurality of sub-pixels PXn and at least one second electrode branch portion 22B branched from the second electrode stem portion 22S in the second direction DR2 in each sub-pixel PXn. The second electrode branch portion 22B may be disposed between the plurality of first electrode branch portions 21B, and a plurality of light emitting elements 30 may be disposed between them.

The first electrode stem portion 21S and the second electrode stem portion 22S may have a shape extending in the first direction DR1. The first electrode stem portion 21S may be disposed so as not to exceed the boundary with the adjacent sub-pixel PXn in the first direction DR1. For example, the first electrode stem portion 21S may be disposed on the first extension portion 41 of the first bank 40. The second electrode stem portion 22S may extend in the first direction DR1 and may be disposed beyond (e.g., may extend beyond) the boundary of the neighboring sub-pixel PXn. One second electrode stem portion 22S may be disposed over a plurality of adjacent sub-pixels PXn in the first direction DR1.

The first electrode stem portion 21S and the second electrode stem portion 22S may be spaced apart from each other in the second direction DR2 within each sub-pixel PXn. The first electrode stem portion 21S may be disposed on the upper side with respect to the center of the sub-pixel PXn, and the second electrode stem portion 22S may be disposed on the lower side with respect to the center of the sub-pixel PXn. However, the present disclosure is not limited thereto. The first electrode stem portion 21S and the second electrode stem portion 22S may be disposed to overlap the first bank 40, respectively, but are not limited thereto. In some embodiments, the first electrode stem portion 21S may be disposed in the sub-pixel PXn and spaced apart from the first bank 40. Also, the second electrode stem portion 22S may extend in the first direction DR1 in the sub-pixel PXn and may be disposed to be spaced apart from the first extension portion 41 of the first bank 40.

The first electrode branch portion 21B may be branched in the second direction DR2 from the first electrode stem portion 21S and may be disposed to be spaced apart from the second electrode stem portion 22S. The second electrode branch portion 22B may be branched in the second direction DR2 from the second electrode stem portion 22S and may be disposed to be spaced apart from the first electrode stem portion 21S. Further, a portion of the first electrode branch portion 21B may be disposed on the second extension portion 42 of the first bank 40, and the second electrode branch portion 22B may be disposed directly on the first planarization layer 19. An embodiment in which two first electrode branch portions 21B and one second electrode branch portion 22B are disposed in each sub-pixel PXn is shown. The first electrode 21 may be disposed to surround (e.g., to extend around) the outer surface of the second electrode branch portion 22B, but the present disclosure is not limited thereto. In each sub-pixel PXn, a greater number of electrode branch portions 21B or 22B may be disposed.

The first electrode stem portion 21S and the second electrode stem portion 22S may be electrically connected to the first conductive pattern CDP and the second voltage line VL2 through the first contact opening CT1 and the second contact opening CT2, respectively. Electrical signals may be applied to the first electrode branch portion 21B and the second electrode branch portion 22B through the electrode stem portions 21S and 22S, respectively.

The plurality of light emitting elements 30 may be disposed between the first electrode branch portion 21B and the second electrode branch portion 22B, and the plurality of contact electrodes 26 and 27 may be disposed on the first electrode branch portion 21B and the second electrode branch portion 22B. The first contact electrode 26 may be disposed on the first electrode branch portion 21B, and the second contact electrode 27 may be disposed on the second electrode branch portion 22B. Other aspects and features are the same or substantially similar as those described above with reference to FIG. 2.

Because the same electrical signal can be applied to the first electrode branch portions 21B through the first electrode stem portion 21S, the light emitting elements 30 disposed between the electrode branch portions 21B and 22B may establish parallel connections with each other. In the display device 10_4 according to the present embodiment, the number of light emitting elements 30 disposed in each sub-pixel PXn is increased, which may increase the amount of light emission per unit pixel PX or sub-pixel PXn.

Figure 21:
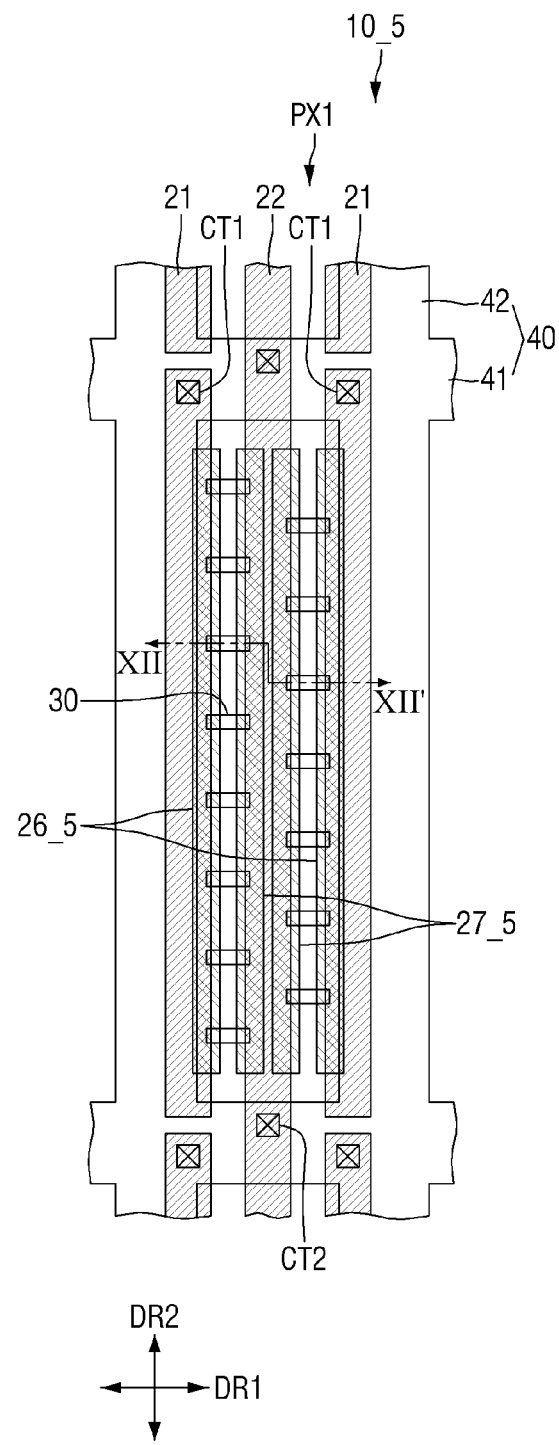
FIG. 21 is a plan view illustrating a sub-pixel of a display device according to still another embodiment.
Figure 22:
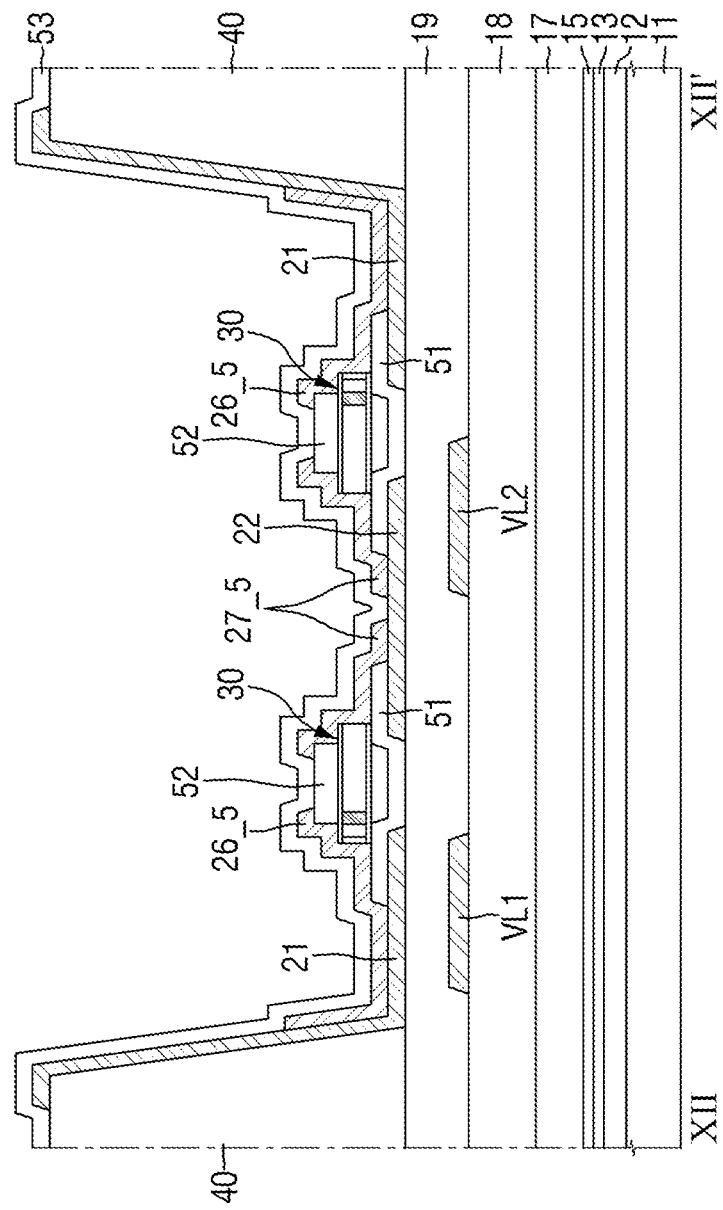
FIG. 22 is a cross-sectional view taken along the line XII-XII' of FIG. 21.

FIG. 21 is a plan view illustrating a sub-pixel of a display device according to another embodiment, and FIG. 22 is a cross-sectional view taken along the line XII-XII' of FIG. 21. The present embodiment is different from the embodiment shown in FIG. 2 in that the contact electrodes 26_5 and 27_5 have the same width. Hereinafter, a description of the same or substantially similar features therebetween may be omitted.

Referring to FIGS. 21 and 22, in a display device 10_5 according to the present embodiment, contact electrodes 26_5 and 27_5 may have the same width, and the second electrode 22 may contact a plurality of second contact electrodes 27_5. Further, the plurality of contact electrodes 26_5 and 27_5 may have a narrower width than the electrodes 21 and 22 and may be disposed to cover only one side of each of the electrodes 21 and 22. Each of the contact electrodes 26_5 and 27_5 may be disposed on the electrodes 21 and 22 such that the first insulating layer 51 is not disposed and cover only the exposed top surface of the electrodes 21 and 22. For example, the first contact electrode 26_5 may be disposed to contact one end portion of the light emitting element 30 and a portion of the top surface of the first electrode 21 and may be disposed to cover only one side of the first electrode 21 facing the second electrode 22. The second contact electrode 27_5 may be disposed to contact the other end portion of the light emitting element 30 and a portion of the top surface of the second electrode 22 and may be disposed to cover only one side of the second electrode 22 facing the first electrode 21.

Those skilled in the art will appreciate that many variations and modifications can be made to the example embodiments described herein without departing from the aspects and features of the present disclosure. Therefore, the disclosed example embodiments of the present disclosure are used in a generic and descriptive sense only and not for purposes of limitation.

What is claimed is:
1. A display device comprising:
a substrate;
a first bank on the substrate, at least portions of the first bank being spaced apart from each other;
a plurality of first electrodes on the substrate, at least portions of the first electrodes being on portions of the first bank;
a second electrode on the substrate, the second electrode being spaced apart from and between adjacent ones of the first electrodes, at least a portion of the second electrode being on a portion of the first bank;
a first insulating layer between the first electrodes and the second electrode and partially covering the first electrodes and the second electrode;
a plurality of light emitting elements on the first insulating layer and overlapping at least a portion of the first electrodes and at least portion of the second electrode with respect to the substrate, the light emitting elements comprising a plurality of semiconductor layers, an active layer between the semiconductor layers, and an insulation layer surrounding a periphery of the active layer and at least portions of the semiconductor layers;

a second insulating layer between the first electrodes and the second electrode and at least partially covering the light emitting elements;

a plurality of first contact electrodes respectively on the first electrodes and contacting one end portion of the light emitting elements; and a second contact electrode on the second electrode and contacting another end portion of the light emitting elements, wherein a length of the light emitting element is longer than a width of the second insulating layer.

2. The display device of claim 1, wherein the first electrodes and the second electrode have the same width measured in one direction.

3. The display device of claim 2, wherein a width of the first contact electrodes is smaller than a width of the second contact electrode.

4. The display device of claim 1, wherein at least a portion of the first contact electrodes overlaps a portion of the first bank in a thickness direction.

5. The display device of claim 1, wherein a length of the light emitting elements is longer than a distance between the first electrodes and the second electrode.

6. The display device of claim 1, further comprising a second bank between the substrate and the second electrode.

7. The display device of claim 6, wherein a height of the second bank is smaller than a height of the first bank.

8. A display device comprising:

a substrate having a plurality of emission regions;

a first bank on the substrate and extending around a periphery of the emission regions, the first bank comprising a first extension portion extending in a first direction and a second extension portion extending in a second direction crossing the first direction;

a plurality of external electrodes extending in the second direction and partially on the second extension portion of the first bank;

a plurality of internal electrodes between the external electrodes and not overlapping the second extension portion of the first bank;

a plurality of light emitting elements between ones of the external electrodes and ones of the internal electrodes or between ones of the internal electrodes;

a plurality of first contact electrodes respectively contacting ones of the external electrodes and one end portion of the light emitting elements; and a plurality of second contact electrodes respectively contacting ones of the internal electrodes and another end portion of the light emitting elements.

9. The display device of claim 8, wherein the external electrodes cross the first extension portion of the first bank.

10. The display device of claim 9, wherein the internal electrodes cross the first extension portion of the first bank.

11. The display device of claim 9, wherein the internal electrodes are spaced apart from the first extension portion of the first bank and are in the emission regions.

12. The display device of claim 8, further comprising a plurality of second banks on the substrate and overlapping the internal electrodes.

13. A display device comprising:

a substrate;

a first bank on the substrate and comprising a first extension portion extending in a first direction and a second extension portion extending in a second direction crossing the first direction;

a first electrode and a second electrode extending in the second direction and partially overlapping the second extension portion of the first bank, the first electrode and the second electrode being spaced apart from each other in the first direction;

a third electrode between the first electrode and the second electrode and extending in the second direction, the third electrode not overlapping the second extension portion of the first bank;

a first light emitting element between the first electrode and the third electrode;

a second light emitting element between the third electrode and the second electrode;

a first contact electrode contacting the first electrode and one end portion of the first light emitting element;

a second contact electrode contacting the second electrode and one end portion of the second light emitting element; and a third contact electrode contacting the third electrode, another end portion of the first light emitting element, and another end portion of the second light emitting element, wherein the first electrode and the second electrode partially overlap the first extension portion of the first bank, and wherein the third electrode does not overlap the first extension portion of the first bank.

14. The display device of claim 13, further comprising a second bank between the substrate and the third electrode and extending in the second direction.

* * * * *